US011824345B2

(12) United States Patent
Ramadass et al.

(10) Patent No.: US 11,824,345 B2
(45) Date of Patent: Nov. 21, 2023

(54) METHODS AND APPARATUS TO IMPROVE PERFORMANCE OF POWER PATH PROTECTION DEVICES

(71) Applicant: Texas Instruments Incorporated, Dallas, TX (US)

(72) Inventors: Yogesh Kumar Ramadass, San Jose, CA (US); Ujwal Radhakrishna, Sunnyvale, CA (US); Jeffrey Morroni, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 225 days.

(21) Appl. No.: 17/011,522

(22) Filed: Sep. 3, 2020

(65) Prior Publication Data

US 2021/0066909 A1 Mar. 4, 2021

Related U.S. Application Data

(60) Provisional application No. 62/895,646, filed on Sep. 4, 2019.

(51) Int. Cl.
*H02H 7/20* (2006.01)
*H03K 17/687* (2006.01)
*H01L 23/525* (2006.01)

(52) U.S. Cl.
CPC .......... *H02H 7/20* (2013.01); *H01L 23/5256* (2013.01); *H03K 17/6871* (2013.01)

(58) Field of Classification Search
CPC ... H02H 7/20; H01L 23/5256; H03K 17/6871
See application file for complete search history.

(56) References Cited

U.S. PATENT DOCUMENTS

2010/0067156 A1* 3/2010 Lark .................... H02H 9/008 361/57
2018/0372072 A1* 12/2018 Danielsen ............... F03D 7/042
2019/0148931 A1* 5/2019 Li ........................ H02H 1/0007 361/77
2019/0386486 A1* 12/2019 Koch ..................... G05F 1/573

(Continued)

OTHER PUBLICATIONS

Components 101, "Different Types of Fuses and their Applications," Jun. 2, 2020, last retrieved Aug. 18, 2020, available online: https://components101.com/articles/different-types-of-fuses-and-their-applications (20 pages).

(Continued)

*Primary Examiner* — Tomi Skibinski
(74) *Attorney, Agent, or Firm* — Frank D. Cimino

(57) ABSTRACT

An example integrated circuit includes: a substrate and a first metal fuse layer on the substrate, the first metal fuse layer having first and second electrical contacts, the first electrical contact adapted to be coupled to an input terminal, the second electrical contact adapted to be coupled to a diode. The example integrated circuit further includes a second metal fuse layer on the substrate, the second metal fuse layer having third and fourth electrical contacts, the third electrical contact coupled to the second electrical contact and adapted to be coupled to the diode, the fourth electrical contact coupled to a shunt circuit.

19 Claims, 8 Drawing Sheets

(56) References Cited

U.S. PATENT DOCUMENTS

2020/0176969 A1* 6/2020 O'Sullivan ............... G06F 1/30
2021/0391709 A1* 12/2021 Wang ...................... H02M 7/44

OTHER PUBLICATIONS

Wikepedia, "Fuse (electrical)," Aug. 17, 2020, last retrieved Aug. 18, 2020, available online: https://en.wikipedia.org/w/index.php?title=Fuse_(electrical)&oldid=973491970 (15 pages).
Fuses Unlimited, "Semiconductor Fuse," last retrieved Aug. 18, 2020, available online: https://www.fusesunlimited.com/products/semiconductorfuse (2 pages).
Semtech, "SI96-01 Surging Ideas TVS Diode Application Note," Sep. 2000 (1 page).
Rakesh Panguloori, Texas Instruments, "Basics of eFuses: Application Report," Dec. 2016—Revised Apr. 2018 (14 pages).
Texas Instruments, "TPS2660x 60-V, 2-A Industrial eFuse With Integrated Reverse Input Polarity Protection," Jul. 2016—Revised Dec. 2019 (54 pages).

* cited by examiner

METHODS AND APPARATUS TO IMPROVE PERFORMANCE OF POWER PATH PROTECTION DEVICES

CROSS-REFERENCE TO RELATED APPLICATION

This patent application claims the benefit of and priority to U.S. Provisional Patent Application Ser. No. 62/895,646, filed on Sep. 4, 2019, which is hereby incorporated herein by reference in its entirety.

TECHNICAL FIELD

This description relates generally to electric circuit protection, and more particularly to methods and apparatus to improve performance of power path protection devices.

BACKGROUND

Electronic fuses or eFuses are integrated power path protection devices that protect circuits during fault conditions. For example, eFuses limit currents and voltages to safe levels that prevent the destruction of other components within a circuit. Whereas discrete fuses are implemented as independent components external to an integrated circuit (IC), eFuses are generally implemented as part of an IC.

SUMMARY

For methods and apparatus to improve performance of power path protection devices, an example integrated circuit includes a substrate and a first metal fuse layer on the substrate, the first metal fuse layer having first and second electrical contacts, the first electrical contact adapted to be coupled to an input terminal, the second electrical contact adapted to be coupled to a diode. The example integrated circuit further includes a second metal fuse layer on the substrate, the second metal fuse layer having third and fourth electrical contacts, the third electrical contact coupled to the second electrical contact and adapted to be coupled to the diode, the fourth electrical contact coupled to a shunt circuit.

DETAILED DESCRIPTION

Figure 1:
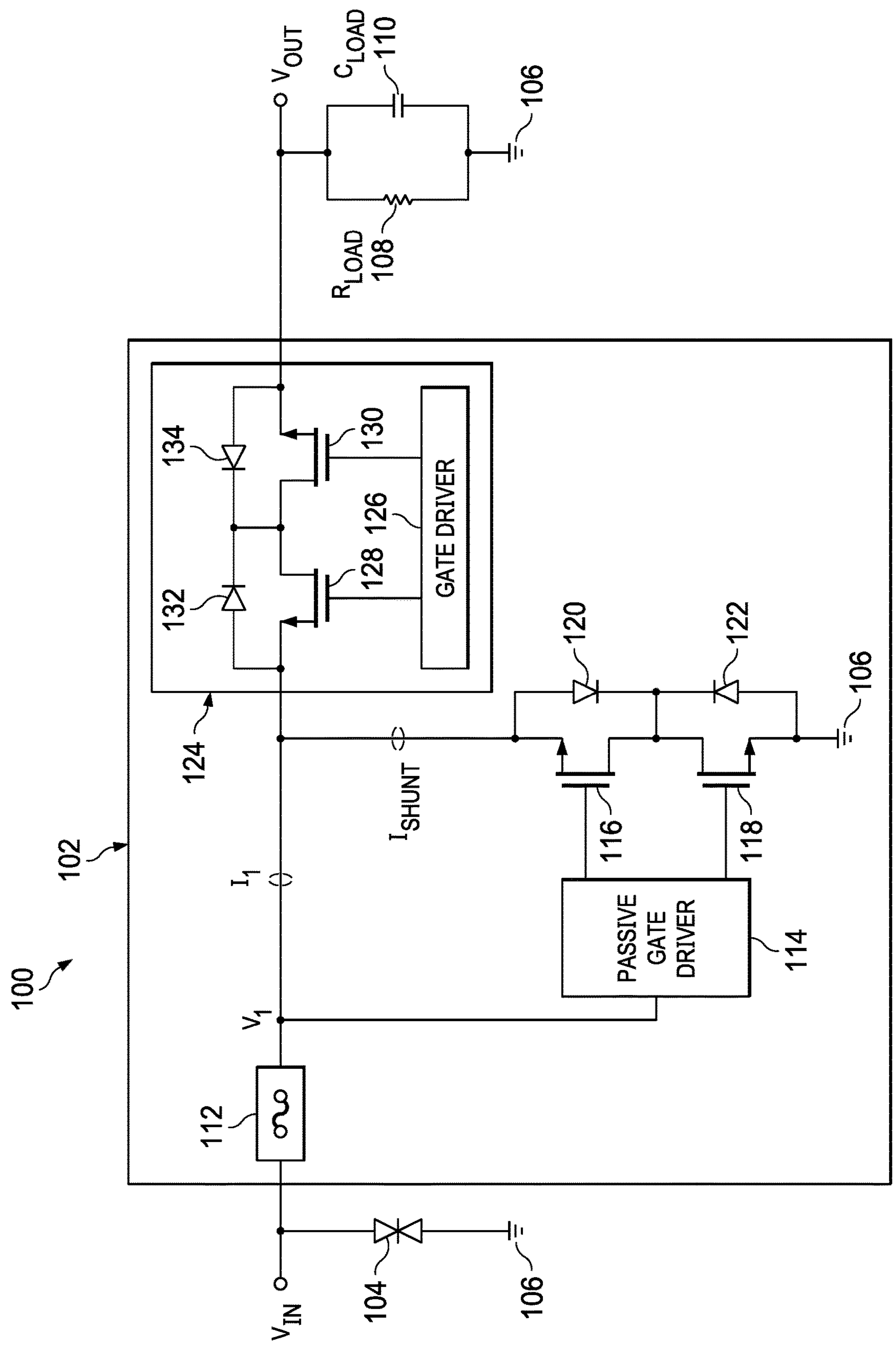
FIG. 1 is a schematic illustration of an example power path protection device to facilitate surge and electrical over stress protection.

The drawings are not to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Discrete fuses, positive temperature coefficient resistors, active circuit protection are some techniques that are employed to protect electrical systems (e.g., circuits) from damage caused by transient events, abnormal events, among others. For example, discrete fuses (e.g., cartridge fuses, automotive fuses, resettable fuses, etc.) generally protect electrical systems from overload or short circuit faults. However, predicting the overcurrent level that will cause a discrete fuse to open is extremely difficult. Thus, according to discrete approaches, a conservative prediction of the overcurrent level can cause the fuse to open for non-damaging events, such as inrush current, resulting in a fuse that must be replaced (e.g., because it has failed open) when no protection was actually needed because the event was non-damaging. For example, while plugging a hard disk drive into a storage system, inrush current can exceed a conservative overcurrent level causing the discrete fuse to unnecessarily open. When a discrete fuse unnecessarily opens, an electrical system (e.g., a circuit) including the discrete fuse is out of service until the discrete fuse is replaced.

While discrete fuses can protect against overcurrent events, discrete fuses are lacking in the ability to control inrush current, protect against reverse current events, protect against overvoltage events, protect against over temperature events, respond and recover from faults, protect against reversed polarity at an input, protect against surge events, provide controlled power down, among others.

Electronic fuses or eFuses provide the capabilities missing in discrete fuses while also maintaining the protections provided by discrete fuses. For example, many eFuses are coupled to or adapted to be coupled to discrete fuses. However, some non-damaging events such as transient voltage shorts, surge events, and electrical overstress (EOS) events, can cause voltage and current levels to briefly exceed the voltage and/or current ratings of some eFuses and/or coupled discrete fuses. For example, for an eFuse rated for voltages up to +/−60 volts (V), if a surge event occurs with voltages exceeding an absolute value of 60 V, such as a surge event resulting in a voltage of +/−500 V, the eFuse and/or coupled discrete fuse can fail open despite the non-damaging event. For example, the current level can exceed the rated current level of the conservatively designed fuse, causing the fuse to deteriorate and become an open circuit. Likewise, during an EOS event, voltages can briefly exceed the voltage rating of an eFuse causing positive and/or negative currents exceeding the current rating of the eFuse to flow through the eFuse. If no precautions are taken, these currents can damage the eFuse.

While it is important to include a discrete fuse (e.g., those that are independent from other circuit protection (e.g., cartridge fuses, automotive fuses, resettable fuses, etc.) to fail open during potentially damaging events that can cripple an electrical system, discrete fuses (e.g., those that are independent from other circuit protection, such as cartridge fuses, automotive fuses, resettable fuses, etc.) are essentially extra parts (e.g., causing an increased part count) that add unneeded capital expenditure and complexity to an electrical system. Examples described herein include an integrated fail open solution that reduces part count and cost, while improving the response time and accuracy. Examples described herein include a power path protection circuit with an integrated two stage fuse assembly and one or more internal clamps. For example, the example power path protection circuit described herein includes an integrated overvoltage protection (OVP) clamping circuit that receives bipolar inputs. For example, examples described herein detect both positive and negative surge events and/or positive and negative EOS events (e.g., positive electrical overstress events and negative electrical overstress events).

Also, examples described herein include one or more fuses that are adapted to be coupled to a power path protection circuit. Alternatively, the one or more fuses can be integrated with the power path protection circuit. In either implementation described herein, the one or more fuses are configured to fail open during lengthy surge events and/or lengthy EOS events. For example, examples described herein detect surge events and/or EOS events via internal clamps. When a surge event and/or EOS event is detected, examples described herein cause one or more internal and/or external fuses to fail open. For example, examples described herein include a shunt current path that allows high current to flow through the one or more internal and/or external fuses causing the one or more fuses to fail open. As such, examples described herein create fail open functionality that is intrinsically safe.

As used herein, connection references (e.g., attached, coupled, adapted to be coupled, connected, joined, among others) are to be construed in light of the specification and, when pertinent, the surrounding claim language. Construction of connection references in the present application shall be consistent with the claim language and the context of the specification which describes the purpose for which various elements are connected. Accordingly, connection references do not necessarily infer that two elements are directly connected and in fixed relation to each other. As used herein, "approximately" and "about" refer to values that may not be exact due to measurement tolerances and/or other real-world imperfections. In another example, "approximately" and "about" refer to values that are within a threshold percentage (e.g., 1%, 5%, etc.) of each other.

FIG. 1 is a schematic illustration 100 of an example power path protection device 102 to facilitate surge and electrical over stress (EOS) protection. The example schematic illustration 100 includes the example power path protection device 102, an example first diode 104, an example ground terminal 106, an example load resistor 108, $R_{LOAD}$, and an example load capacitor 110, $C_{LOAD}$. The example power path protection device 102 includes an example fuse assembly 112, an example passive gate driver 114, an example first shunt switch 116, an example second shunt switch 118, an example second diode 120, an example third diode 122, and an example eFuse 124. The example eFuse 124 includes an example gate driver 126, an example blocking switch 128, an example passing switch 130, an example fourth diode 132, and an example fifth diode 134.

Figure 2:
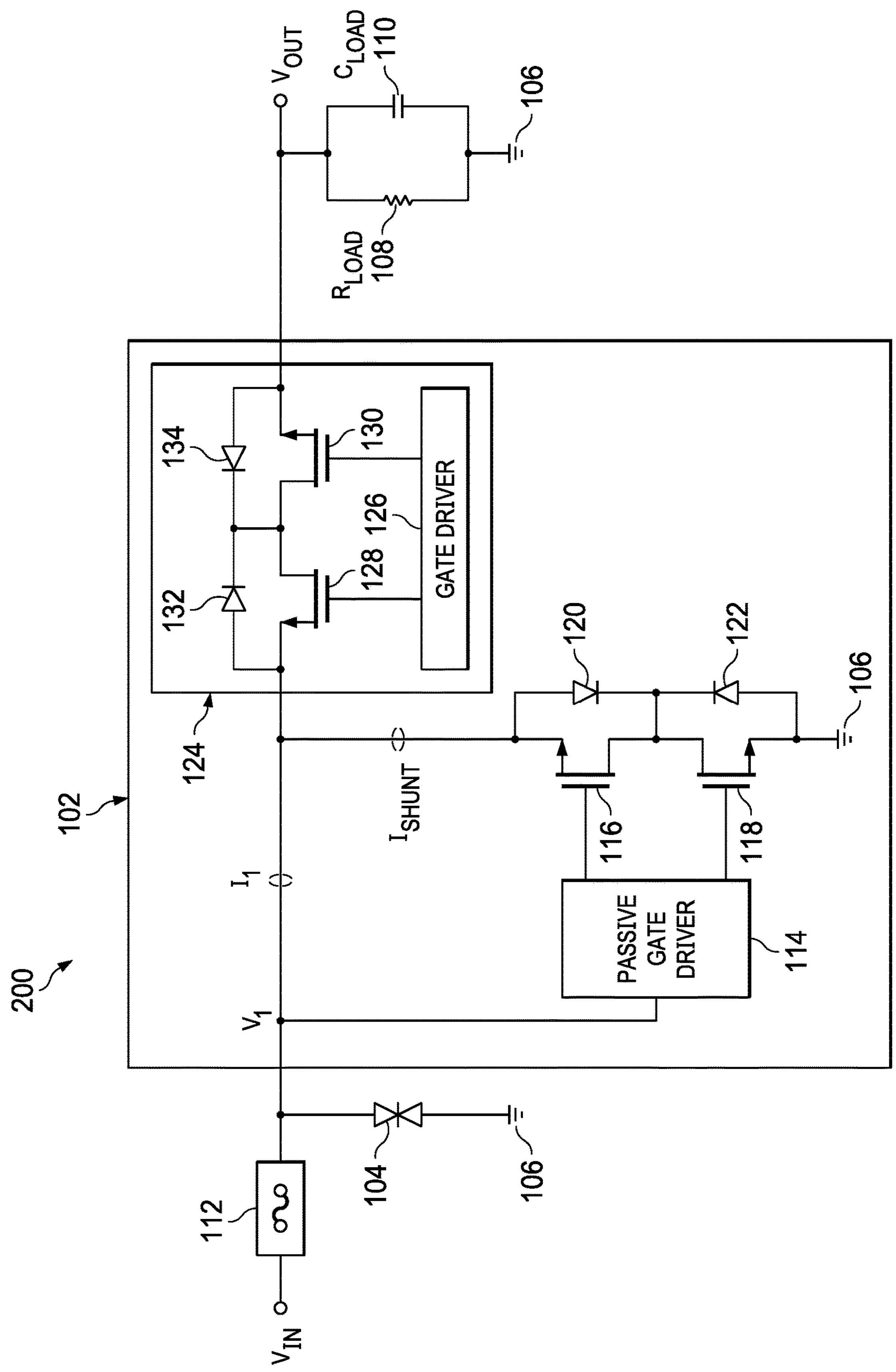
FIG. 2 is a schematic illustration of an alternative implementation of the example power path protection device of FIG. 1.
Figure 3:
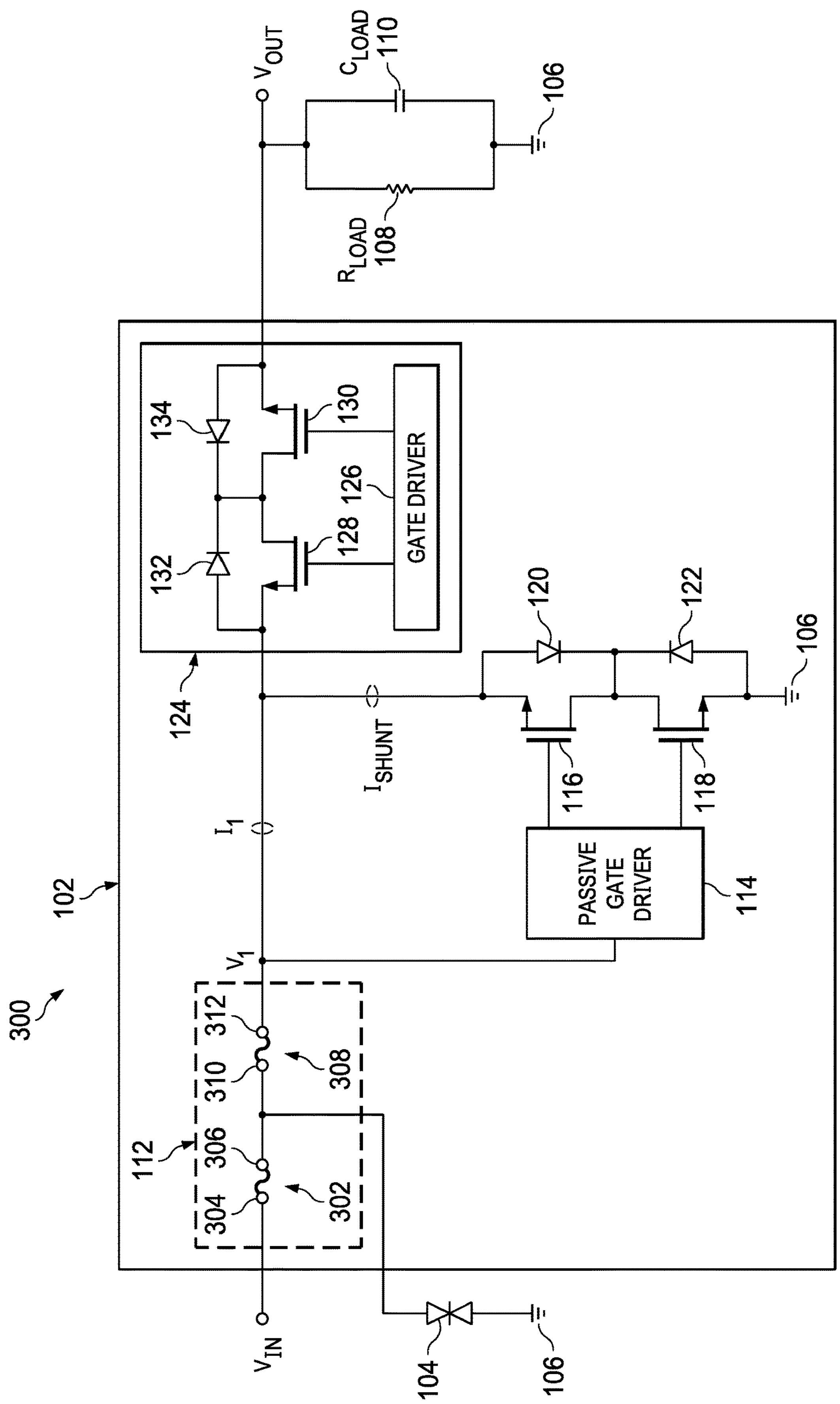
FIG. 3 is a schematic illustration of an alternative implementation of the example power path protection device of FIG. 1.

In the illustrated example of FIG. 1, the power path protection device 102 may be implemented according to at least three implementations (e.g., shown in FIGS. 1, 2, and 3). For example, the power path protection device 102 may be implemented by an integrated circuit (IC) including a substrate, a two stage fuse (e.g., the fuse assembly 112), and an internal shunt clamp circuit (e.g., the passive gate driver 114, the first shunt switch 116, the second shunt switch 118, the second diode 120, and/or the third diode 122). In examples described herein, the shunt clamp circuit may be referred to as a shunt circuit and/or an active shunt clamp circuit. In the illustrated example of FIG. 1, each of the example first diode 104, the example second diode 120, the example third diode 122, the example fourth diode 132, and the example fifth diode 134 includes an example anode and an example cathode. In the example of FIG. 1, each of the example load resistor 108, $R_{LOAD}$, and the example load capacitor 110, $C_{LOAD}$, includes an example first terminal and an example second terminal. In the example of FIG. 1, the example fuse assembly 112 includes an example first terminal and an example second terminal. In some examples, the example fuse assembly 112 includes an example third terminal.

In the illustrated example of FIG. 1, the example passive gate driver 114 includes an example input, an example first output, and an example second output. In some examples, the passive gate driver 114 includes an example second input. In the example of FIG. 1, each of the example first shunt switch 116, the example second shunt switch 118, the example blocking switch 128, and the example passing switch 130 are implemented by an example N-channel metal-oxide-semiconductor field-effect transistor (MOSFET) including an example gate terminal, an example drain terminal, and an example source terminal. As used herein, the terms "gate terminal," "drain terminal," and/or "source terminal" may be used interchangeably with the terms "gate," "drain" and/or "source," respectively.

In the illustrated example of FIG. 1, the anode of the first diode 104 is coupled to an input voltage node $V_{IN}$ and adapted to be coupled to the first terminal of the fuse assembly 112. As used herein, the terms "node" and "terminal" may be used interchangeably to refer to a point that a connection is made and/or can be made. For example, the anode of the first diode 104 is coupled to the first terminal of the fuse assembly 112 and the input voltage node $V_{IN}$ by 10 bond wires to support surge currents. The cathode of the first diode 104 is coupled to the ground terminal 106. In the example of FIG. 1, the first diode 104 is implemented by a bipolar transient voltage suppression (TVS) diode rated for 250 amps (A) with a breakdown voltage of +/−45 V. Accordingly, the first diode 104 shunts excess current when the voltage at the input voltage node $V_{IN}$ (e.g., input voltage terminal $V_{IN}$, input terminal $V_{IN}$) and is greater than the positive breakdown voltage of the first diode 104 and clamps the voltage at the anode of the first diode 104 to the clamping voltage (e.g., 45 V). Additionally or alternatively, the first diode 104 shunts excess current when the voltage the ground terminal 106 is less than the negative breakdown voltage of the first diode 104 and clamps the voltage at the cathode of the first diode 104 to the clamping voltage (e.g., −45 V). Accordingly, the first diode 104 advantageously shunts excess current (e.g., surge current) caused by surge events to prevent such surge events (e.g., positive surge events and/or negative surge events) from damaging the eFuse 124. In additional or alternative examples, the first diode 104 can be implemented by any number of suitable diodes for a desired application.

In the illustrated example of FIG. 1, the ground terminal 106 is implemented as a reference node (e.g., at 0 V) for the components of the schematic illustration 100. In the example of FIG. 1, the load resistor 108, $R_{LOAD}$, and the load capacitor 110, $C_{LOAD}$, are representative of a load (e.g., an industrial load) coupled to the power path protection device 102. For example, the load resistor 108, $R_{LOAD}$, and the load capacitor 110, $C_{LOAD}$, represent an electric motor.

In the illustrated example of FIG. 1, the first terminal of the load resistor 108, $R_{LOAD}$, is coupled to the first terminal of the load capacitor 110, $C_{LOAD}$, and an output voltage node $V_{OUT}$, and adapted to be coupled to the source terminal of the passing switch 130 and the anode of the fifth diode 134.

The second terminal of the load resistor 108, $R_{LOAD}$, is coupled to the second terminal of the load capacitor 110, $C_{LOAD}$, and the ground terminal 106. The first terminal of the load capacitor 110, $C_{LOAD}$, is coupled to the first terminal of the load resistor 108, $R_{LOAD}$, and the output voltage node $V_{OUT}$, and adapted to be coupled to the source terminal of the passing switch 130 and the anode of the fifth diode 134. The second terminal of the load capacitor 110, $C_{LOAD}$, is coupled to the second terminal of the load resistor 108, $R_{LOAD}$, and the ground terminal 106.

In the illustrated example of FIG. 1, the first terminal of the fuse assembly 112 is adapted to be coupled to the input voltage node $V_{IN}$ and the anode of the first diode 104. For example, the first terminal of the fuse assembly 112 is adapted to be coupled to the input voltage node $V_{IN}$ and the anode of the first diode 104 by 10 bond wires to support surge currents. The second terminal of the fuse assembly 112 is coupled to the input of the passive gate driver 114, the source terminal of the first shunt switch 116, the source terminal of the blocking switch 128, and the another of the fourth diode 132. In the example of FIG. 1, the fuse assembly 112 can be implemented by one or more fuses. In the example of FIG. 1, the fuse assembly 112 is integrated with the power path protection device 102. In additional or alternative examples, one or more of the fuses of the fuse assembly 112 can be integrated with the power path protection device 102 and/or external to the power path protection device 102.

In the illustrated example of FIG. 1, in a first implementation, the fuse assembly 112 implemented by a single fuse that is configured to conduct 2.5 A during normal operation and to fail open when the current is greater than or equal to 10 A for at most 10 microseconds (μs) (e.g., if the current flowing through the fuse assembly 112 is 10 A, the fuse assembly 112 will fail open within 10 μs). In the first implementation, the fuse assembly 112 may be implemented in multiple manners. For example, the fuse assembly 112 may include a metallization layer (e.g., a metal layer) comprising a 10 μm thick layer of copper. In an alternative example, the fuse assembly 112 may include a metallization layer (e.g., a metal layer) comprising a 6 μm thick layer of copper. In other examples, the fuse assembly 112 may include a metallization layer (e.g., a metal layer) comprising a 3 μm thick layer of aluminum. Preferably, in the first implementation, the fuse assembly 112 includes a metallization layer (e.g., a metal layer) comprising a 3 μm thick layer of damascene copper (DCU). In the first implementation, the width of the fuse assembly 112 is configured such that the fuse assembly 112 will fail open at 10 A as described above and the length of the fuse assembly 112 is configured such that the fuse assembly 112 has a resistance of less than 10 milli-Ohms (mΩ) at room temperature. Alternatively, in a second implementation, the fuse assembly 112 is implemented by two fuses. Additional description of the second implementation of the fuse assembly 112 will be described in connection with at least FIG. 3.

In the illustrated example of FIG. 1, the input of the passive gate driver 114 is coupled to the second terminal of the fuse assembly 112 at a first voltage node $V_1$, the first output of the passive gate driver 114 is coupled to the gate terminal of the first shunt switch 116 and the second output of the passive gate driver 114 is coupled to the gate terminal of the second shunt switch 118. In the example of FIG. 1, the passive gate driver 114 is implemented by one or more resistors, one or more MOSFETs, one or more diodes, one or more comparators, one or more logic gates, and/or one or more capacitors. In additional or alternative examples, the passive gate driver 114 can be implemented by any number of logic gates, comparators, and/or any other suitable circuit component for a desired application. The passive gate driver 114 is configured to enable (e.g., close) and/or disable (e.g., open) the first shunt switch 116 and/or the second shunt switch 118 based on EOS events in a manner that allows the first shunt switch 116 and/or the second shunt switch 118 to sink shunt current, $I_{SHUNT}$, between the first voltage node $V_1$ and the ground terminal 106. In examples described herein, the shunt current, $I_{SHUNT}$, is equivalent to the value of first current, $I_1$, flowing between the first voltage node $V_1$ and the eFuse 124.

In the illustrated example of FIG. 1, the passive gate driver 114 may be implemented according to at least two implementations. In examples described herein, the passive gate driver 114 is powered based on the voltage at the first voltage node $V_1$ and/or the voltage at the ground terminal 106. In this manner, the passive gate driver 114 is a passive component. Generally, the passive gate driver 114 actively monitors the voltage at the first voltage node $V_1$. In this manner, the passive gate driver 114 can be referred to as an active component. Responsive to detecting an EOS event (e.g., a positive EOS event, an EOS event with a voltage greater than or equal to 60 V, a negative EOS event, an EOS event with a voltage less than or equal to −60 V, etc.), the passive gate driver 114 engages a clamp internal to the passive gate driver 114. Subsequently, the passive gate driver 114 determines whether the voltage at the first voltage node $V_1$ satisfies a threshold voltage indicative of an EOS event. Responsive to the voltage at the first voltage node $V_1$ satisfying the threshold voltage, the passive gate driver 114 causes at least one of the first shunt switch 116 or the second shunt switch 118 to conduct. Accordingly, the passive gate driver 114 advantageously causes at least one of the first shunt switch 116 or the second shunt switch 118 to conduct to prevent current from the EOS event from potentially damaging the eFuse 124. For example, during a positive EOS event, the passive gate driver 114 causes the second shunt switch 118 to conduct, causing current resulting from the positive EOS event (e.g., resulting from positive electrical overstress events, positive electrical overstress event current, etc.) to flow through the second diode 120 and the second shunt switch 118 to the ground terminal 106. Additionally or alternatively, during a negative EOS event, the passive gate driver 114 causes the first shunt switch 116 to conduct, causing current resulting from the negative EOS event (e.g., resulting from negative electrical overstress events, negative electrical overstress event current, etc.) to flow through the third diode 122 and the first shunt switch 116 to the fuse assembly 112. For example, the passive gate driver 114 is configured to cause the fuse assembly 112 to fail open during electrical overstress (EOS) events that last longer than 50 μs. Together, the passive gate driver 114, the first shunt switch 116, the second shunt switch 118, the second diode 120, and the third diode 122 form an active shunt clamp circuit (e.g., a shunt circuit) that acts as a sink for current resulting from positive electrical overstress events (e.g., a positive electrical overstress event current) and a source for current resulting from negative electrical overstress events (e.g., a negative electrical overstress event current). Additional description of the passive gate driver 114 will be described in connection with at least FIGS. 2, 3, 4, 5, 6, 7, and 8.

In the illustrated example of FIG. 1, the first shunt switch 116 is implemented by an N-channel MOSFET sized to sink 10 A and rated for 65 V. In additional or alternative examples, the first shunt switch 116 can be implemented by any number of suitable transistors for a desired application. The gate terminal of the first shunt switch 116 is coupled to the first output of the passive gate driver 114. The source terminal of the first shunt switch 116 is coupled to the second terminal of the fuse assembly 112, the input of the passive gate driver 114, the anode of the second diode 120, the source terminal of the blocking switch 128, and the anode of the fourth diode 132. In some examples, the gate terminal of the first shunt switch 116 is coupled to the source terminal of the first shunt switch 116 to ensure that the first shunt switch 116 is enabled (e.g., closed) and/or disabled (e.g., opened) when desired. The drain terminal of the first shunt switch 116 is coupled to the drain terminal of the second shunt switch 118, the cathode of the second diode 120, and the cathode of the third diode 122. During a negative EOS event, the first shunt switch 116 advantageously sinks the shunt current, $I_{SHUNT}$, to prevent current equivalent to the shunt current, $I_{SHUNT}$, from flowing through the eFuse 124. For example, during a negative EOS event, the shunt current, $I_{SHUNT}$, flows from the ground terminal 106 through the third diode 122, the first shunt switch 116, and the fuse assembly 112 to the input voltage node $V_{IN}$.

In the illustrated example of FIG. 1, the second shunt switch 118 is implemented by an N-channel MOSFET sized to sink 10 A and rated for 65 V. In additional or alternative examples, the second shunt switch 118 can be implemented by any number of suitable transistors for a desired application. The gate terminal of the second shunt switch 118 is coupled to the second output of the passive gate driver 114. The source terminal of the second shunt switch 118 is coupled to the ground terminal 106 and the anode of the third diode 122. In some examples, the gate terminal of the second shunt switch 118 is coupled to the source terminal of the second shunt switch 118 to ensure that the second shunt switch 118 is enabled (e.g., closed) and/or disabled (e.g., opened) when desired. The drain terminal of the second shunt switch 118 is coupled to the drain terminal of the first shunt switch 116, the cathode of the second diode 120, and the cathode of the third diode 122. During a positive EOS event, the second shunt switch 118 advantageously sinks the shunt current, $I_{SHUNT}$, to prevent current equivalent to the shunt current, $I_{SHUNT}$, from flowing through the eFuse 124. For example, during a positive EOS event, the shunt current, $I_{SHUNT}$, flows from the input voltage node $V_{IN}$ through the fuse assembly 112, the second diode 120, and the second shunt switch 118 to the ground terminal 106.

In the illustrated example of FIG. 1, the anode of the second diode 120 is coupled to the second terminal of the fuse assembly 112, the first input of the passive gate driver 114, the source terminal of the first shunt switch 116, the source terminal of the blocking switch 128, and the anode of the fourth diode 132. The cathode of the second diode 120 is coupled to the drain terminal of the first shunt switch 116, the drain terminal of the second shunt switch 118, and the cathode of the third diode 122. The second diode 120 is configured to sink current during positive EOS events. In the example of FIG. 1, the anode of the third diode 122 is coupled to the ground terminal 106 and the source terminal of the second shunt switch 118. The cathode of the third diode 122 is coupled to the drain terminal of the first shunt switch 116, the drain terminal of the second shunt switch 118, and the cathode of the second diode 120. The third diode 122 is configured to sink current during negative EOS events.

In the illustrated example of FIG. 1, the example gate driver 126 includes a first output and a second output. The first output of the gate driver 126 is coupled to the gate terminal of the blocking switch 128. The second output of the gate driver 126 is coupled to the gate terminal of the passing switch 130. In the example of FIG. 1, the gate driver 126 is implemented by one or more resistors, one or more MOSFETs, one or more diodes, one or more comparators, one or more logic gates, and/or one or more capacitors. In additional or alternative examples, the gate driver 126 can be implemented by any number of logic gates, comparators, and/or any other suitable circuit component for a desired application. The gate driver 126 is configured to enable (e.g., close) and/or disable (e.g., open) the blocking switch 128 and/or the passing switch 130 based on the flow of current between the input voltage node $V_{IN}$ and the output voltage node $V_{OUT}$.

In the illustrated example of FIG. 1, the blocking switch 128 is implemented by an N-channel MOSFET sized to be three times the size of the first shunt switch 116 and the second shunt switch 118. In additional or alternative examples, the blocking switch 128 can be implemented by any number of suitable transistors for a desired application. The blocking switch 128 is and rated for 60 V. The gate terminal of the blocking switch 128 is coupled to the first output of the gate driver 126. The source terminal of the blocking switch 128 is coupled to the second terminal of the fuse assembly 112, the input of the passive gate driver 114, the source terminal of the first shunt switch 116, the anode of the second diode 120, and the anode of the fourth diode 132. The drain terminal of the blocking switch 128 is coupled to the drain terminal of the passing switch 130, the cathode of the fourth diode 132, and the cathode of the fifth diode 134.

In the illustrated example of FIG. 1, the passing switch 130 is implemented by an N-channel MOSFET s sized to be three times the size of the first shunt switch 116 and the second shunt switch 118. In additional or alternative examples, the passing switch 130 can be implemented by any number of suitable transistors for a desired application. The passing switch 130 is and rated for 60 V. The gate terminal of the passing switch 130 is coupled to the second output of the gate driver 126. The source terminal of the passing switch 130 is coupled to the anode of the fifth diode 134 and adapted to be coupled to the output voltage node $V_{OUT}$, the first terminal of the load resistor 108, $R_{LOAD}$, the first terminal of the load capacitor 110, $C_{LOAD}$. The drain terminal of the passing switch 130 is coupled to the drain terminal of the blocking switch 128, the cathode of the fourth diode 132, and the cathode of the fifth diode 134.

In the illustrated example of FIG. 1, the anode of the fourth diode 132 is coupled to the second terminal of the fuse assembly 112, the first input of the passive gate driver 114, the source terminal of the first shunt switch 116, the source terminal of the blocking switch 128, and the anode of the second diode 120. The cathode of the fourth diode 132 is coupled to the drain terminal of the blocking switch 128, the drain terminal of the passing switch 130, and the cathode of the fifth diode 134. In the example of FIG. 1, the anode of the fifth diode 134 is coupled to the source terminal of the passing switch 130 and adapted to be coupled to the output voltage node $V_{OUT}$, the first terminal of the load resistor 108, $R_{LOAD}$, the first terminal of the load capacitor 110, $C_{LOAD}$. The cathode of the fifth diode 134 is coupled to the drain terminal of the blocking switch 128, the drain terminal of the passing switch 130, and the cathode of the fourth diode 132.

In the illustrated example of FIG. 1, the effective resistance to current flowing through the first shunt switch 116 and the third diode 122 is 5Ω. In the example of FIG. 1, the effective resistance to current flowing through the second shunt switch 118 and the second diode 120 is 5Ω. In the example of FIG. 1, the effective resistance to current flowing through the blocking switch 128 and the fifth diode 134 is 150 mΩ. In the example of FIG. 1, the effective resistance to current flowing through the passing switch 130 and the fourth diode 132 is 150 mΩ.

FIG. 2 is a schematic illustration 200 of an alternative implementation of the example power path protection device 102 of FIG. 1. The alternate implementation of the power path protection device 102 illustrated in FIG. 2 is substantially similar to that illustrated in FIG. 1. However, in the example of FIG. 2, the fuse assembly 112 is implemented external to the power path protection device 102.

In the illustrated example of FIG. 2, the first terminal of the fuse assembly 112 is coupled to the input voltage node $V_{IN}$. For example, the first terminal of the fuse assembly 112 is coupled to the input voltage node $V_{IN}$ by 10 bond wires (e.g., via multiple bond wires) to support surge currents. The second terminal of the fuse assembly 112 is coupled to the anode of the first diode 104 and adapted to be coupled to the input of the passive gate driver 114, the source terminal of the first shunt switch 116, the anode of the second diode 120, the source terminal of the blocking switch 128, and the anode of the fourth diode 132. In the example of FIG. 2, the anode of the first diode 104 is coupled to the second terminal of the fuse assembly 112 and adapted to be coupled to the input of the passive gate driver 114, the source terminal of the first shunt switch 116, the anode of the second diode 120, the source terminal of the blocking switch 128, and the anode of the fourth diode 132.

FIG. 3 is a schematic illustration 300 of an alternative implementation of the example power path protection device 102 of FIG. 1. The alternate implementation of the power path protection device 102 illustrated in FIG. 3 is substantially similar to that illustrated in FIG. 1. However, in the example of FIG. 3, the example fuse assembly 112 is implemented by an example first fuse 302 having an example first electrical contact 304 and an example second electrical contact 306 and an example second fuse 308 having an example first electrical contact 310 and an example second electrical contact 312. Accordingly, the schematic illustration 300 illustrates the second implementation of the fuse assembly 112.

In the illustrated example of FIG. 3, the first electrical contact 304 of the first fuse 302 is adapted to be coupled to the input voltage node $V_{IN}$. For example, the first electrical contact 304 of the first fuse 302 is adapted to be coupled to the input voltage node $V_{IN}$ by 10 bond wires (e.g., via multiple bond wires) to support surge currents. In the example of FIG. 3, the first electrical contact 304 of the first fuse 302 corresponds to the first terminal of the fuse assembly 112. The second electrical contact 306 of the first fuse 302 is coupled to the first electrical contact 310 of the second fuse 308 and adapted to be coupled to the anode of the first diode 104. For example, the second electrical contact 306 of the first fuse 302 is adapted to be coupled to the anode of the first diode 104 by 10 bond wires (e.g., via multiple bond wires) to support surge currents.

In the illustrated example of FIG. 3, the first fuse 302 is configured to handle surges of up 250 A (e.g., 500 V at 2Ω) that last between 8 and 28 μs. The first fuse 302 of the fuse assembly 112 is implemented as a metallization layer (e.g., a metal layer) disposed on (e.g., fixed to the top surface, with respect to the base plate of an IC package including the first fuse 302) of a substrate (e.g., a wafer) comprising the power path protection device 102. In such an example, the first fuse 302 includes a 10 μm thick layer of copper. In the example of FIG. 3, the width of the first fuse 302 of the fuse assembly 112 is configured such that the first fuse 302 of the fuse assembly 112 will fail open at 250 A as described above and the length of the first fuse 302 of the fuse assembly 112 is configured such that the first fuse 302 of the fuse assembly 112 has a resistance of less than 1.5 mΩ at room temperature. For example, the first fuse 302 of the fuse assembly 112 is 500 μm by 300 μm. In some examples, the first fuse 302 of the fuse assembly 112 can be 500 μm by 100 μm. In additional or alternative examples, the first fuse 302 can be implemented as a metallization layer (e.g., a metal layer) positioned in any suitable location (e.g., bottom surface with respect to the base plate of an IC package including the first fuse 302, middle layer with respect to the base plate of an IC package including the first fuse 302, etc.) of a substrate (e.g., a wafer) comprising the power path protection device 102.

In the illustrated example of FIG. 3, the first electrical contact 310 of the second fuse 308 is coupled to the second electrical contact 306 of the first fuse 302 and adapted to be coupled to the anode of the first diode 104. For example, the first electrical contact 310 of the second fuse 308 is coupled to the second electrical contact 306 of the first fuse 302 and adapted to be coupled to the anode of the first diode 104 by 10 bond wires (e.g., via multiple bond wires) to support surge currents. The second electrical contact 312 of the second fuse 308 is coupled to the input of the passive gate driver 114, the source terminal of the first shunt switch 116, the anode of the second diode 120, the source terminal of the blocking switch 128, and the anode of the fourth diode 132. In the example of FIG. 3, the second electrical contact 312 of the second fuse 308 corresponds to the second terminal of the fuse assembly 112. In the example of FIG. 3, the second electrical contact 306 of the first fuse 302 and the first electrical contact 310 of the second fuse 308 operate as a third terminal of the fuse assembly 112.

In the illustrated example of FIG. 3, the second fuse 308 of the fuse assembly 112 is configured to conduct up to 8 A at room temperature and to fail open when the current is greater than or equal to 10 A for at most 800 μs (e.g., if the current flowing through the second fuse 308 of the fuse assembly 112 is 10 A, the second fuse 308 of the fuse assembly 112 will fail open within 800 μs). The second fuse 308 is configured to provide current resulting from electrical overstress (EOS) events from the first electrical contact 310 of the second fuse 308 to the input of the passive gate driver 114 as well as to the source terminal of the first shunt switch 116. The second fuse 308 of the fuse assembly 112 is implemented as a metallization layer (e.g., a metal layer) disposed on (e.g., fixed to the top surface, with respect to the base plate of an IC package including the second fuse 308) of a substrate (e.g., a wafer) comprising the power path protection device 102. In such an example, the second fuse 308 includes a metallization layer (e.g., a metal layer) comprising a 3 μm thick layer of copper (e.g., DCU). In the example of FIG. 3, the width of the second fuse 308 of the fuse assembly 112 is configured such that the second fuse 308 of the fuse assembly 112 will fail open at 10 A as described above and the length of the second fuse 308 of the fuse assembly 112 is configured such that the second fuse 308 of the fuse assembly 112 has a resistance of less than or equal to 8 mΩ at room temperature. For example, the second fuse of the fuse assembly 112 can be between 100 μm by 100 μm and 100 μm by 300 μm. In additional or alternative examples, the second fuse 308 can be implemented as a metallization layer (e.g., a metal layer) positioned in any suitable location (e.g., bottom surface with respect to the base plate of an IC package including the second fuse 308, middle layer with respect to the base plate of an IC package including the second fuse 308, etc.) of a substrate (e.g., a wafer) comprising the power path protection device 102.

In the illustrated example of FIG. 3, during surge events where the voltage is greater than 65 V (e.g., up to 500 V), surge current (e.g., 250 A) flows through the first fuse 302 and the first diode 104. For example, during such a surge event, the surge voltage is greater than the positive breakdown voltage of the first diode 104 causing the first diode 104 to shunt the surge current and clamp the voltage at the anode of the first diode 104 to the clamping voltage (e.g., 60 V). Additionally or alternatively, during surge events where the voltage is less than −65 V (e.g., down to −500 V), surge current (e.g., −250 A) flows through the first diode 104 and the first fuse 302. For example, during such a surge event, the surge voltage is less than the negative breakdown voltage of the first diode 104 causing the first diode 104 to shunt the surge current and clamp the voltage at the cathode of the first diode 104 to the clamping voltage (e.g., −60 V). Accordingly, the first diode 104 advantageously shunts excess current caused by surge events to prevent such surge events (e.g., positive surge events and/or negative surge events) from damaging the eFuse 124.

In the illustrated example of FIG. 3, during EOS events where the voltage is between 0 V and 65 V, the passive gate driver 114 causes, based on detecting the EOS event, current caused by the EOS event to flow through the first fuse 302, the second fuse 308, the second diode 120, and the second shunt switch 118 as the shunt current, $I_{SHUNT}$. During EOS events where the voltage is between −65 V and 0 V, the passive gate driver 114 causes, based on detecting the EOS event, current caused by the EOS event to flow through the third diode 122, the first shunt switch 116, the second fuse 308, and the first fuse 302 as the shunt current, $I_{SHUNT}$. For example, the passive gate driver 114 reacts to and protects the eFuse 124 from EOS events (e.g., bipolar EOS events) within in 10 s of µs's.

As described, each of the first shunt switch 116 and the second shunt switch 118 are rated for current caused by EOS events between −65 V and 65 V (e.g., +/−10 A). Accordingly, the passive gate driver 114 advantageously causes such currents to shunt through the first shunt switch 116, the second shunt switch 118, the second diode 120, and/or the third diode 122 to prevent damage to the eFuse 124. In this manner, the passive gate driver 114 handles EOS events (e.g., within a threshold of the safe operating area (SOA) of the eFuse 124 (e.g., +/−5 volts), +/−65 V, etc.) while the first fuse 302 and the first diode 104 handle surge events (e.g., greater than the threshold of the SOA of the eFuse 124, less than −65 V and/or greater than 65 V, etc.).

Figure 4:
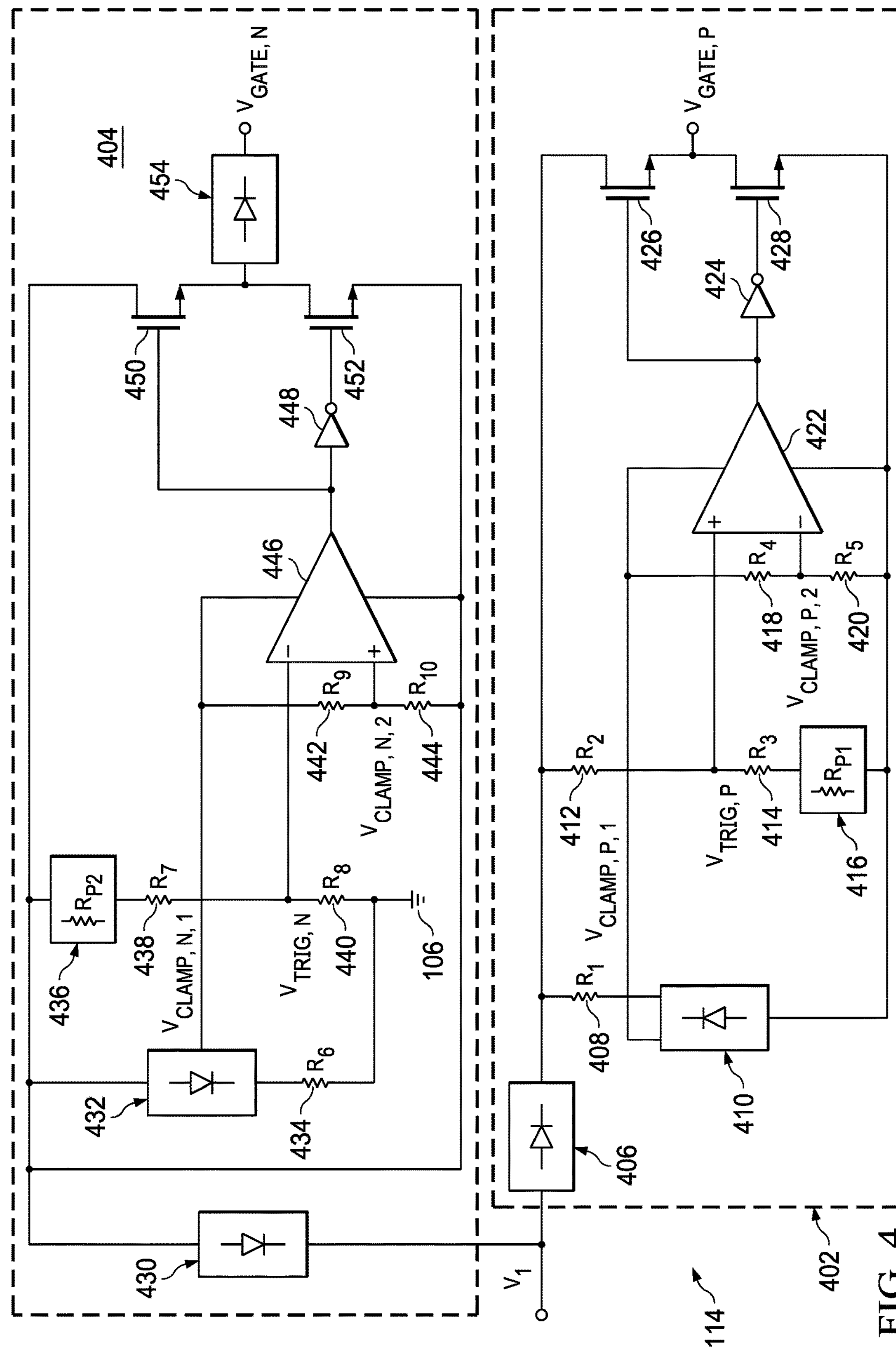
FIG. 4 is a schematic illustration showing an example implementation of the passive gate driver of FIG. 1.

FIG. 4 is a schematic illustration showing an example implementation of the passive gate driver 114 of FIG. 1. In the example of FIG. 4, the example passive gate driver 114 includes an example positive gate driver 402 and an example negative gate driver 404. In the example of FIG. 4, the example positive gate driver 402 includes the example ground terminal 106, an example first diode assembly 406, an example first resistor 408, $R_1$, an example second diode assembly 410, an example second resistor 412, $R_2$, an example third resistor 414, $R_3$, an example first potentiometer 416, $R_{P1}$, an example fourth resistor 418, $R_4$, an example fifth resistor 420, $R_5$, an example first comparator 422, an example first inverter 424, an example first driver switch 426, and an example second driver switch 428.

In the illustrated example of FIG. 4, the example negative gate driver 404 includes the example ground terminal 106, an example third diode assembly 430, an example fourth diode assembly 432, an example sixth resistor 434, $R_6$, an example second potentiometer 436, $R_{P2}$, an example seventh resistor 438, $R_7$, an example eighth resistor 440, $R_8$, an example ninth resistor 442, $R_9$, an example tenth resistor 444, $R_{10}$, an example second comparator 446, an example second inverter 448, an example third driver switch 450, an example fourth driver switch 452, and an example fifth diode assembly 454.

In the illustrated example of FIG. 4, each of the first resistor 408, $R_1$, the second resistor 412, $R_2$, the third resistor 414, $R_3$, the fourth resistor 418, $R_4$, the fifth resistor 420, $R_5$, the sixth resistor 434, $R_6$, the seventh resistor 438, $R_7$, the eighth resistor 440, $R_8$, the ninth resistor 442, $R_9$, and the tenth resistor 444, $R_{10}$, includes a first terminal and a second terminal. In the example of FIG. 4, each of the first diode assembly 406, the third diode assembly 430, and the fifth diode assembly 454 includes a first terminal and a second terminal. In the example of FIG. 4, each of the second diode assembly 410 and the fourth diode assembly 432 includes a first terminal, a second terminal, and a third terminal. In the example of FIG. 4, each of the first potentiometer 416, $R_{P1}$, and the second potentiometer 436, $R_{P2}$, includes a first terminal and a second terminal.

In the illustrated example of FIG. 4, each of the first comparator 422 and the second comparator 446 includes a non-inverting input, an inverting input, a positive supply input, a negative supply input, and an output. In the example of FIG. 4, each of the first inverter 424 and the second inverter 448 includes an input and an output. In the example of FIG. 4, each of the first driver switch 426, the second driver switch 428, the third driver switch 450, and the fourth driver switch 452 is implemented by an example MOSFET including an example gate terminal, an example drain terminal, and an example source terminal.

In the illustrated example of FIG. 4, the first terminal of the first diode assembly 406 is coupled to the first voltage node $V_1$ and the second terminal of the third diode assembly 430 and corresponds to the first input of the passive gate driver 114. The second terminal of the first diode assembly 406 is coupled to the first terminal of the first resistor 408, $R_1$, the first terminal of the second resistor 412, $R_2$, and the drain terminal of the first driver switch 426. In the example of FIG. 4, the first diode assembly 406 is implemented by one or more MOSFETs and/or one or more diodes. In additional or alternative examples, the first diode assembly 406 can be implemented by any number of suitable circuit components for a desired application. In the example of FIG. 4, the first diode assembly 406 operates as a half-wave rectifier to react to positive voltages. For example, when the voltage at the first voltage node $V_1$ forward biases the first diode assembly 406, the first diode assembly 406 will allow current to flow from the first voltage node $V_1$ to the first terminal of the first resistor 408, $R_1$, the first terminal of the second resistor 412, $R_2$, and the drain terminal of the first driver switch 426.

In the illustrated example of FIG. 4, the first terminal of the first resistor 408, $R_1$, is coupled to the second terminal of the first diode assembly 406, the first terminal of the second resistor 412, $R_2$, and the drain terminal of the first driver switch 426. The second terminal of the first resistor 408, $R_1$, is coupled to the third terminal of the second diode assembly 410. In the example of FIG. 4, the resistance of the first resistor 408, $R_1$, is configured such that the voltage drop across the first resistor 408, $R_1$, during a positive EOS event will cause a first positive clamp voltage $V_{CLAMP,\ P,\ 1}$ to be between 5V and 6V. In the example of FIG. 4, the first terminal of second diode assembly 410 is coupled to the ground terminal 106, the second terminal of the first potentiometer 416, $R_{P1}$, the second terminal of the fifth resistor 420, $R_5$, the negative supply input of the first comparator 422, and the source terminal of the second driver switch 428. The second terminal of the second diode assembly 410 is coupled to the first terminal of the fourth resistor 418, $R_4$, and the positive supply input of the first comparator 422 The third terminal of the second diode assembly 410 is coupled to the second terminal of the first resistor 408, $R_1$. In the example of FIG. 4, the second diode assembly 410 is implemented by one or more diodes and/or one or more capacitors. In additional or alternative examples, the second diode assembly 410 can be implemented by any number of suitable circuit components for a desired application.

In the illustrated example of FIG. 4, the second diode assembly 410 operates as a positive voltage clamp. For example, during a positive EOS event, the second diode assembly 410 clamps the voltage at the third terminal of the second diode assembly 410 to approximately 6.7 V. The second diode assembly 410 clamps the first positive clamp voltage $V_{CLAMP,\ P,\ 1}$ based on the voltage at the third terminal of the second diode assembly 410. The first positive clamp voltage $V_{CLAMP,\ P,\ 1}$ is then output at the second terminal of the second diode assembly 410. For example, the second diode assembly 410 clamps the first positive clamp voltage $V_{CLAMP,\ P,\ 1}$ between 5 and 6 V (e.g., $5\ V \leq V_{CLAMP,\ P,\ 1} \leq 6\ V$).

In the illustrated example of FIG. 4, the first terminal of the second resistor 412, $R_2$, is coupled to the second terminal of the first diode assembly 406, the first terminal of the first resistor 408, $R_1$, and the drain terminal of the first driver switch 426. The second terminal of the second resistor 412, $R_2$, is coupled to the first terminal of the third resistor 414, $R_3$, and the non-inverting input of the first comparator 422. The first terminal of the third resistor 414, $R_3$, and the non-inverting input of the first comparator 422. The second terminal of the third resistor 414, $R_3$, is coupled to the first terminal of the first potentiometer 416, $R_{P1}$. Together, the second resistor 412, $R_2$, and the third resistor 414, $R_3$, operate as part of a voltage divider network, which is configured to reduce the voltage at the first terminal of the second resistor 412, $R_2$, to a positive trigger voltage $V_{TRIG,\ P}$ between the second terminal of the second resistor 412, $R_2$, and the first terminal of the third resistor 414, $R_3$.

In the illustrated example of FIG. 4, the first terminal of the first potentiometer 416, $R_{P1}$, is coupled to the second terminal of the third resistor 414, $R_3$. The second terminal of the first potentiometer 416, $R_{P1}$, is coupled to the ground terminal 106, the first terminal of the second diode assembly 410, the second terminal of the fifth resistor 420, $R_5$, the negative supply input of the first comparator 422, and the source terminal of the second driver switch 428. In the example of FIG. 4, the first potentiometer 416, $R_{P1}$, is implemented by one or more MOSFETs and/or one or more resistors. In additional or alternative examples, the first potentiometer 416, $R_{P1}$, can be implemented by any number of suitable circuit components for a desired application. In the example of FIG. 4, the first potentiometer 416, $R_{P1}$, allows for the voltage divider network including the second resistor 412, $R_2$, and the third resistor 414, $R_3$, to be trimmed. For example, the first potentiometer 416, $R_{P1}$, can be adjusted to increase and/or decrease the positive trigger voltage $V_{TRIG,\ P}$. Accordingly, the positive trigger voltage $V_{TRIG,\ P}$ is equal to the product of: (a) the voltage at the first voltage node $V_1$ minus the voltage drop across the first diode assembly 406; and (b) the quotient of (i) the sum of the resistance of the third resistor 414, $R_3$, and the resistance of the first potentiometer 416, $R_{P1}$, and (ii) the sum of the resistance of the second resistor 412, $R_2$, the resistance of the third resistor 414, $R_3$, and the resistance of the first potentiometer 416, $R_{P1}$ (e.g., $V_{TRIG,}$ $$_{P} = (V_1 - V_{406}) * \frac{R_3 + R_{P1}}{R_2 + R_3 + R_{P1}}).$$

In the illustrated example of FIG. 4, the first terminal of the fourth resistor 418, $R_4$, is coupled to the second terminal of the second diode assembly 410 and the positive supply of the first comparator 422. The second terminal of the fourth resistor 418, $R_4$, is coupled to the first terminal of the fifth resistor 420, $R_5$, and the inverting terminal of the first comparator 422. The first terminal of the fifth resistor 420, $R_5$, is coupled to the second terminal of the fourth resistor 418, $R_4$, and the inverting terminal of the first comparator 422. The second terminal of the fifth resistor 420, $R_5$, is coupled to the ground terminal 106, the first terminal of the second diode assembly 410, the second terminal of the first potentiometer 416, $R_{P1}$, the negative supply input of the first comparator 422, and the source terminal of the second driver switch 428.

In the illustrated example of FIG. 4, the fourth resistor 418, $R_4$, and the fifth resistor 420, $R_5$, operate as a voltage divider network, which is configured to reduce the voltage at the second terminal of the second diode assembly 410 (e.g., the first positive clamp voltage $V_{CLAMP,\ P,\ 1}$), to a second positive clamp voltage $V_{CLAMP,\ P,\ 2}$ between the second terminal of the fourth resistor 418, $R_4$, and the first terminal of the fifth resistor 420, $R_5$. Accordingly, the second positive clamp voltage $V_{CLAMP,\ P,\ 2}$ is equal to the product of: (a) the first positive clamp voltage $V_{CLAMP,\ P,\ 1}$; and (b) the quotient of (i) the resistance of the fifth resistor 420, $R_5$, and (ii) the sum of the resistance of the fourth resistor 418, $R_4$, and the resistance of the fifth resistor 420, $$R_5 \left(\text{e.g., } V_{CLAMP,P,2} = V_{CLAMP,P,1} * \frac{R_5}{R_4 + R_5}\right).$$

In the example of FIG. 4, the voltage divider including the fourth resistor 418, $R_4$, and the fifth resistor 420, $R_5$, is configured to reduce the first positive clamp voltage $V_{CLAMP,\ P,\ 1}$ by half $$\left(\text{e.g., } \frac{R_5}{R_4 + R_5} = 0.5\right).$$

Also, in the example of FIG. 4, the voltage divider including the fourth resistor 418, $R_4$, and the fifth resistor 420, $R_5$, is configured such that the quiescent current of the voltage divider is 1.5 μA.

In the illustrated example of FIG. 4, the non-inverting input of the first comparator 422 is coupled to the second terminal of the second resistor 412, $R_2$, and the first terminal of the third resistor 414, $R_3$, to receive the positive trigger voltage $V_{TRIG,\ P}$. The inverting input of the first comparator 422 is coupled to the second terminal of the fourth resistor 418, $R_4$, and the first terminal of the fifth resistor 420, $R_5$, to receive the second positive clamp voltage $V_{CLAMP,\ P,\ 2}$. The positive supply input of first comparator 422 is coupled to the second terminal of the second diode assembly 410 and the first terminal of the fourth resistor 418, $R_4$. The negative supply input of the first comparator 422 is coupled to the ground terminal 106, the first terminal of the second diode assembly 410, the second terminal of the first potentiometer 416, $R_{P1}$, the second terminal of the fifth resistor 420, $R_5$, and the source terminal of the second driver switch 428. The output of the first comparator 422 is coupled to the input of the first inverter 424 and the gate terminal of the first driver switch 426.

In the illustrated example of FIG. 4, the first comparator 422 is implemented by an operational amplifier. In additional or alternative examples, the first comparator 422 can be implemented by any number of logic gates, comparators, triggers (e.g., Schmitt triggers) and/or any other suitable circuit component for a desired application. In the example of FIG. 4, the quiescent current of the first comparator 422 is 2 μA. In the example of FIG. 4, the first comparator 422 monitors the positive trigger voltage $V_{TRIG,\ P}$ to determine whether the positive trigger voltage $V_{TRIG,\ P}$ is greater than the second positive clamp voltage $V_{CLAMP,\ P,\ 2}$. Responsive to determining that the positive trigger voltage $V_{TRIG,\ P}$ has exceeded the second positive clamp voltage $V_{CLAMP,\ P,\ 2}$ (e.g., 2.5 V≤$V_{TRIG,\ P}$≤3 V), the first comparator 422 outputs a logic high value (e.g., a binary 1, a 5 V signal, etc.). In examples described herein, the positive trigger voltage $V_{TRIG,\ P}$ exceeding the second positive clamp voltage $V_{CLAMP,\ P,\ 2}$ is indicative of the voltage at the first voltage node $V_1$ exceeding 55 V. Responsive to determining that the positive trigger voltage $V_{TRIG,\ P}$ has not exceeded the second positive clamp voltage $V_{CLAMP,\ P,\ 2}$, the first comparator 422 outputs a logic low value (e.g., a binary 0, a 0 V signal, etc.). In this manner, when the voltage at the first voltage node $V_1$ exceeds an absolute value of 55 V, the first comparator 422 outputs a logic high value.

In the illustrated example of FIG. 4, the input of the first inverter 424 is coupled to the output of the first comparator 422 and the gate terminal of the first driver switch 426. The output of the first inverter 424 is coupled to the gate terminal of the second driver switch 428. In the example of FIG. 4, the first inverter 424 is implemented by a NOT gate. In additional or alternative examples, the first inverter 424 can be implemented by any number of suitable circuit components for a desired application, such as one or more MOSFETs. In the example of FIG. 4, the first inverter 424 inverts the logic value at the output of the first comparator 422 and transmits the inverted value to the gate terminal of the second driver switch 428.

In the illustrated example of FIG. 4, the first driver switch 426 is implemented by a laterally-diffused metal-oxide semiconductor (LDMOS) field-effect transistor (FET) rated for 65 V. In additional or alternative examples, the first driver switch 426 can be implemented by any number of suitable transistors for a desired application. The gate terminal of the first driver switch 426 is coupled to the output of the first comparator 422 and the input of the first inverter 424. The source terminal of the first driver switch 426 is coupled to the drain terminal of the second driver switch 428, and a positive EOS gate drive node $V_{GATE,\ P}$. In the example of FIG. 4, the positive EOS gate drive node $V_{GATE,\ P}$ corresponds to the second output of the passive gate driver 114. The drain terminal of the first driver switch 426 is coupled to the second terminal of the first diode assembly 406, the first terminal of the first resistor 408, $R_1$, and the first terminal of the second resistor 412, $R_2$.

In the illustrated example of FIG. 4, the second driver switch 428 is implemented by an N-channel MOSFET rated for 5 V. In additional or alternative examples, the second driver switch 428 can be implemented by any number of suitable transistors for a desired application. The gate terminal of the second driver switch 428 is coupled to the output of the first inverter 424. The source terminal of the second driver switch 428 is coupled to the ground terminal 106, the first terminal of the second diode assembly 410, the second terminal of the first potentiometer 416, $R_{P1}$, the second terminal of the fifth resistor 420, $R_5$, and the negative supply input of the first comparator 422. The drain terminal of the second driver switch 428 is coupled to the source terminal of the first driver switch 426, and the positive EOS gate drive node $V_{GATE,\ P}$.

In the illustrated example of FIG. 4, the first terminal of the third diode assembly 430 is coupled to the first terminal of the fourth diode assembly 432, the first terminal of the second potentiometer 436, $R_{P2}$, the drain terminal of the third driver switch 450, the second terminal of the tenth resistor 444, $R_{10}$, the positive supply input of the second comparator 446, and the source terminal of the fourth driver switch 452. In the example of FIG. 4, the second terminal of the third diode assembly 430 is coupled to the first voltage node $V_1$ and the first terminal of the first diode assembly 406 and corresponds to the first input of the passive gate driver 114.

In the illustrated example of FIG. 4, the third diode assembly 430 is implemented by one or more diodes. In additional or alternative examples, the third diode assembly 430 can be implemented by any number of suitable circuit components for a desired application. In the example of FIG. 4, the third diode assembly 430 operates as a half-wave rectifier to react to negative voltages. For example, when the voltage at the first voltage node $V_1$ forward biases the third diode assembly 430, the third diode assembly 430 will allow current to flow from the first terminal of the second potentiometer 436, $R_{P2}$, and the drain terminal of the third driver switch 450 to the first voltage node $V_1$.

In the illustrated example of FIG. 4, the first terminal of the sixth resistor 434, $R_6$, is coupled to the second terminal of the fourth diode assembly 432. The second terminal of the sixth resistor 434, $R_6$, is coupled to the second terminal of the eighth resistor 440, $R_8$, and the ground terminal 106. In the example of FIG. 4, the resistance of the sixth resistor 434, $R_6$, is configured such that the voltage drop across the sixth resistor 434, $R_6$, during a negative EOS event will cause a first negative clamp voltage $V_{CLAMP,\ N,\ 1}$ to be between −55V and −54V. In the example of FIG. 4, the first terminal of fourth diode assembly 432 is coupled to the first terminal of the third diode assembly 430, the first terminal of the second potentiometer 436, $R_{P2}$, the drain terminal of the third driver switch 450, the second terminal of the tenth resistor 444, $R_{10}$, the positive supply input of the second comparator 446, and the source terminal of the fourth driver switch 452. The second terminal of the fourth diode assembly 432 is coupled to the first terminal of the sixth resistor 434, $R_6$. The third terminal of the fourth diode assembly 432 is coupled to the first terminal of the ninth resistor 442, $R_9$, and the negative supply input of the second comparator 446.

In the illustrated example of FIG. 4, the fourth diode assembly 432 is implemented by one or more diodes. In additional or alternative examples, the fourth diode assembly 432 can be implemented by any number of suitable circuit components for a desired application. In the example of FIG. 4, the fourth diode assembly 432 operates as a negative voltage clamp. For example, during a negative EOS event, the fourth diode assembly 432 clamps the voltage at the second terminal of the fourth diode assembly 432 to approximately −53.3 V. The fourth diode assembly 432 clamps the first negative clamp voltage $V_{CLAMP, N, 1}$ based on the voltage at the second terminal of the fourth diode assembly 432. The first negative clamp voltage $V_{CLAMP, N, 1}$ is then output at the third terminal of the fourth diode assembly 432. For example, the fourth diode assembly 432 clamps the first negative clamp voltage $V_{CLAMP, N, 1}$ between −55 and −54 V (e.g., $-55\ V \leq V_{CLAMP, N, 1} \leq -54\ V$).

In the illustrated example of FIG. 4, the first terminal of the eighth resistor 440, $R_8$, is coupled to the second terminal of the seventh resistor 438, $R_7$, and the inverting input of the second comparator 446. The second terminal of the eighth resistor 440, $R_8$, is coupled to the second terminal of the sixth resistor 434, $R_6$, and the ground terminal 106. The first terminal of the seventh resistor 438, $R_7$, is coupled to the second terminal of the second potentiometer 436, $R_{P2}$. The second terminal of the seventh resistor 438, $R_7$, is coupled to the first terminal of the eighth resistor 440, $R_8$, and the inverting input of the second comparator 446. Together, the seventh resistor 438, $R_7$, and the eighth resistor 440, $R_8$, operate as a voltage divider network, which is configured to reduce the voltage at the ground terminal 106 to a negative trigger voltage $V_{TRIG, N}$ between the second terminal of the seventh resistor 438, $R_7$, and the first terminal of the eighth resistor 440, $R_8$.

In the illustrated example of FIG. 4, the first terminal of the second potentiometer 436, $R_{P2}$, is coupled to the first terminal of the third diode assembly 430, the first terminal of the fourth diode assembly 432, the drain terminal of the third driver switch 450, the second terminal of the tenth resistor 444, $R_{10}$, the positive supply input of the second comparator 446, and the source terminal of the fourth driver switch 452. The second terminal of the second potentiometer 436, $R_{P2}$, is coupled to the first terminal of the seventh resistor 438, $R_7$. In the example of FIG. 4, the second potentiometer 436, $R_{P2}$, is implemented by one or more MOSFETs and/or one or more resistors. In additional or alternative examples, the second potentiometer 436, $R_{P2}$, can be implemented by any number of suitable circuit components for a desired application. In the example of FIG. 4, the second potentiometer 436, $R_{P2}$, allows for the voltage divider network including the seventh resistor 438, $R_7$, and the eighth resistor 440, $R_8$, to be trimmed. For example, the second potentiometer 436, $R_{P2}$, can be adjusted to increase and/or decrease the negative trigger voltage $V_{TRIG, N}$. Accordingly, the negative trigger voltage $V_{TRIG, N}$ is equal to the product of: (a) the voltage at the ground terminal 106 (e.g., 0 V) minus the sum of the voltage at the first voltage node $V_1$ and the voltage drop across the third diode assembly 430; and (b) the quotient of (i) the sum of the resistance of the seventh resistor 438, $R_7$, and the resistance of the second potentiometer 436, $R_{P2}$, and (ii) the sum of the resistance of the eighth resistor 440, $R_8$, the resistance of the seventh resistor 438, $R_7$, and the resistance of the second potentiometer 436, $$R_{P2}\left(\text{e.g., } V_{TRIG,N} = (0 - V_1 + V_{430}) * \frac{R_7 + R_{P2}}{R_8 + R_7 + R_{P2}}\right).$$

In the illustrated example of FIG. 4, the first terminal of the tenth resistor 444, $R_{10}$, is coupled to the second terminal of the ninth resistor 442, $R_9$, and the non-inverting input of the second comparator 446. The second terminal of the tenth resistor 444, $R_{10}$, is coupled to the first terminal of the third diode assembly 430, the first terminal of the fourth diode assembly 432, the first terminal of the second potentiometer 436, $R_{P2}$, the drain terminal of the third driver switch 450, the positive supply input of the second comparator 446, and the source terminal of the fourth driver switch 452. The first terminal of the ninth resistor 442, $R_9$, is coupled to the third terminal of the fourth diode assembly 432 and the negative supply input of the second comparator 446. The second terminal of the fifth resistor 420, $R_5$, is coupled to the first terminal of the tenth resistor 444, $R_{10}$, and the non-inverting input of the second comparator 446.

In the illustrated example of FIG. 4, the ninth resistor 442, $R_9$, and the tenth resistor 444, $R_{10}$, operate as a voltage divider network, which is configured to reduce the voltage at the third terminal of the fourth diode assembly 432 (e.g., the first negative clamp voltage $V_{CLAMP, N, 1}$), to a second negative clamp voltage $V_{CLAMP, N, 2}$ between the second terminal of the ninth resistor 442, $R_9$, and the first terminal of the tenth resistor 444, $R_{10}$. Accordingly, the second negative clamp voltage $V_{CLAMP, N, 2}$ is equal to the product of: (a) the difference between (i) the first negative clamp voltage $V_{CLAMP, N, 1}$ and (ii) the sum the voltage at the first voltage node $V_1$ and the voltage drop across the third diode assembly 430; and (b) the quotient of (i) the resistance of the ninth resistor 442, $R_9$, and (ii) the sum of the resistance of the ninth resistor 442, $R_9$, and the resistance of the tenth resistor 444, $$R_{10}\left(\text{e.g., } V_{CLAMP,N,2} = (V_{CLAMP,N,1} - V_1 + V_{430}) * \frac{R_9}{R_9 + R_{10}}\right).$$

In the example of FIG. 4, the voltage divider including the ninth resistor 442, $R_9$, and the tenth resistor 444, $R_{10}$, is configured to reduce the first negative clamp voltage $V_{CLAMP, N, 1}$ by half the difference between the first negative clamp voltage $V_{CLAMP, N, 1}$ and the voltage at the first voltage node $V_1$ $$\left(\text{e.g., } \frac{R_9}{R_9 + R_{10}} = 0.5\right).$$

Also, in the example of FIG. 4, the voltage divider including the ninth resistor 442, $R_9$, and the tenth resistor 444, $R_{10}$, is configured such that the quiescent current of the voltage divider is 1.5 μA.

In the illustrated example of FIG. 4, the non-inverting input of the second comparator 446 is coupled to the second terminal of the ninth resistor 442, $R_9$, and the first terminal of the tenth resistor 444, $R_{10}$, to receive the second negative clamp voltage $V_{CLAMP, N, 2}$. The inverting input of the second comparator 446 is coupled to the first terminal of the third diode assembly 430, the first terminal of the fourth diode assembly 432, the first terminal of the second potentiometer 436, $R_{P2}$, the drain terminal of the third driver switch 450, the second terminal of the tenth resistor 444, $R_{10}$, and the source terminal of the fourth driver switch 452. The negative supply input of the second comparator 446 is coupled to the third terminal of the fourth diode assembly 432 and the first terminal of the ninth resistor 442, $R_9$. The output of the second comparator 446 is coupled to the input of the second inverter 448 and the gate terminal of the third driver switch 450.

In the illustrated example of FIG. 4, the second comparator 446 is implemented by an operational amplifier. In additional or alternative examples, the second comparator 446 can be implemented by any number of logic gates, comparators, triggers (e.g., Schmitt triggers) and/or any other suitable circuit component for a desired application. In the example of FIG. 4, the quiescent current of the second comparator 446 is 2 μA. In the example of FIG. 4, the second comparator 446 monitors the negative trigger voltage $V_{TRIG,\ N}$ to determine whether the negative trigger voltage $V_{TRIG,\ N}$ is less than the second negative clamp voltage $V_{CLAMP,\ N,\ 2}$. Responsive to determining that the negative trigger voltage $V_{TRIG,\ N}$ has exceeded (e.g., more negative) the second negative clamp voltage $V_{CLAMP,\ N,\ 2}$ (e.g., −57 $V \leq V_{TRIG,\ N} \leq -57.5$ V), the second comparator 446 outputs a logic high value (e.g., a binary 1, a 5 V signal, etc.). In examples described herein, the negative trigger voltage $V_{TRIG,\ N}$ exceeding the second negative clamp voltage $V_{CLAMP,\ N,\ 2}$ is indicative of the voltage at the first voltage node $V_1$ exceeding −55 V. Responsive to determining that the negative trigger voltage $V_{TRIG,\ N}$ has not exceeded the second negative clamp voltage $V_{CLAMP,\ N,\ 2}$, the second comparator 446 outputs a logic low value (e.g., a binary 0, a 0 V signal, etc.). In this manner, when the voltage at the first voltage node $V_1$ exceeds an absolute value of 55 V, the second comparator 446 outputs a logic high value.

In the illustrated example of FIG. 4, the input of the second inverter 448 is coupled to the output of the second comparator 446 and the gate terminal of the third driver switch 450. The output of the second inverter 448 is coupled to the gate terminal of the fourth driver switch 452. In the example of FIG. 4, the second inverter 448 is implemented by a NOT gate. In additional or alternative examples, the second inverter 448 can be implemented by any number of suitable circuit components for a desired application, such as one or more MOSFETs. In the example of FIG. 4, the second inverter 448 inverts the logic value at the output of the second comparator 446 and transmits the inverted value to the gate terminal of the fourth driver switch 452.

In the illustrated example of FIG. 4, the third driver switch 450 is implemented by an LDMOS FET rated for 65 V. In additional or alternative examples, the third driver switch 450 can be implemented by any number of suitable transistors for a desired application. The gate terminal of the third driver switch 450 is coupled to the output of the second comparator 446 and the input of the second inverter 448. The source terminal of the third driver switch 450 is coupled to the drain terminal of the fourth driver switch 452, and the first terminal of the fifth diode assembly 454. The drain terminal of the third driver switch 450 is coupled to the first terminal of the third diode assembly 430, the first terminal of the fourth diode assembly 432, the first terminal of the second potentiometer 436, $R_{P2}$, the second terminal of the tenth resistor 444, $R_{10}$, the positive supply input of the second comparator 446, and the source terminal of the fourth driver switch 452.

In the illustrated example of FIG. 4, the fourth driver switch 452 is implemented by an N-channel MOSFET rated for 5 V. In additional or alternative examples, the fourth driver switch 452 can be implemented by any number of suitable transistors for a desired application. The gate terminal of the fourth driver switch 452 is coupled to the output of the second inverter 448. The source terminal of the fourth driver switch 452 is coupled to the first terminal of the third diode assembly 430, the first terminal of the fourth diode assembly 432, the first terminal of the second potentiometer 436, $R_{P2}$, the drain terminal of the third driver switch 450, the second terminal of the tenth resistor 444, $R_{10}$, and the positive supply input of the second comparator 446. The drain terminal of the fourth driver switch 452 is coupled to the first terminal of the fifth diode assembly 454.

In the illustrated example of FIG. 4, the first terminal of the fifth diode assembly 454 is coupled to the source terminal of the third driver switch 450 and the drain terminal of the fourth driver switch 452. The second terminal of the fifth diode assembly 454 is coupled to a negative EOS gate drive node $V_{GATE,\ N}$. In the example of FIG. 4, the negative EOS gate drive node $V_{GATE,\ N}$ corresponds to the first output of the passive gate driver 114. In the example of FIG. 4, the fifth diode assembly 454 is implemented by one or more diodes. In additional or alternative examples, the fifth diode assembly 454 can be implemented by any number of suitable circuit components for a desired application. In the example of FIG. 4, the fifth diode assembly 454 operates as protective element to protect the fourth driver switch 452 during positive EOS events.

In the illustrated example of FIG. 4, in example operation, the passive gate driver 114 monitors the voltage at the first voltage node $V_1$. More specifically, the positive gate driver 402 monitors the first voltage node $V_1$ for positive EOS events and the negative gate driver 404 monitors the first voltage node $V_1$ for negative EOS events. For example, the second diode assembly 410 and the first comparator 422 monitor the voltage at the first voltage node $V_1$ (e.g., via the first diode assembly 406). Responsive to detecting a positive EOS event (e.g., a voltage greater than or equal to 60 V, etc.), the second diode assembly 410 engages, clamping the voltage at the second terminal of the second diode assembly 410 to the first positive clamp voltage $V_{CLAMP,\ P,\ 1}$. Subsequently, the first comparator 422 determines whether the positive trigger voltage $V_{TRIG,\ P}$ is greater than the second positive clamp voltage $V_{CLAMP,\ P,\ 2}$ (e.g., a positive threshold voltage). Responsive to determining that the positive trigger voltage $V_{TRIG,\ P}$ is greater than the second positive clamp voltage $V_{CLAMP,\ P,\ 2}$, the first comparator 422 outputs a logic high value, enabling (e.g., closing) the first driver switch 426 and causing the first inverter 424 to disable (e.g., open) the second driver switch 428. By enabling (e.g., closing) the first driver switch 426, the first comparator 422 causes a logic high value to be present at the positive EOS gate drive node $V_{GATE,\ P}$ (e.g., to the second output of the passive gate driver 114, the gate terminal of the second shunt switch 118, etc.). Also, because the third diode assembly 430 is not forward biased, a logic low value is present at the negative EOS gate drive node $V_{GATE,\ N}$ (e.g., to the first output of the passive gate driver 114, the gate terminal of the first shunt switch 116, etc.). In this manner, during a positive EOS event, the first comparator 422 causes the second shunt switch 118 to conduct thereby causing current resulting from the positive EOS event to flow through the second diode 120 and the second shunt switch 118 to the ground terminal 106. In this manner, the passive gate driver 114 advantageously prevents current resulting from the positive EOS event from potentially damaging the eFuse 124.

In the illustrated example of FIG. 4, when the voltage at the first voltage node $V_1$ exceeds the breakdown voltage of the third diode assembly 430 (e.g., during a negative EOS event), the third diode assembly 430 conducts current. Accordingly, the fourth diode assembly 432 and the second comparator 446 monitor the voltage at the first voltage node $V_1$ (e.g., via the third diode assembly 430). Also, the voltage at the first terminal of the third diode assembly 430, the first terminal of the fourth diode assembly 432, the first terminal of the second potentiometer 436, $R_{P2}$, the drain terminal of the third driver switch 450, the second terminal of the tenth resistor 444, $R_{10}$, the positive input supply of the second comparator 446, and the source terminal of the fourth driver switch 452 is approximately equal to that at the first voltage node $V_1$ (e.g., significantly below the voltage at the ground terminal 106, ≤−65V, etc.). Responsive to the voltage at the first terminal of the fourth diode assembly 432 being below the voltage at the ground terminal 106 (e.g., detecting a negative EOS event, such as a voltage less than or equal to 60 V, etc.), the fourth diode assembly 432 engages, clamping the voltage at the third terminal of the fourth diode assembly 432 to the first negative clamp voltage $V_{CLAMP, N, 1}$. Subsequently, the second comparator 446 determines whether the negative trigger voltage $V_{TRIG, N}$ is less than the second negative clamp voltage $V_{CLAMP, N, 2}$ (e.g., a negative threshold voltage). Responsive to determining that the negative trigger voltage $V_{TRIG, N}$ is less than the second negative clamp voltage $V_{CLAMP, N, 2}$, the second comparator 446 outputs a logic high value, enabling (e.g., closing) the third driver switch 450 and causing the second inverter 448 to disable (e.g., open) the fourth driver switch 452. By enabling (e.g., closing) the third driver switch 450, the second comparator 446 causes approximately the voltage at the first terminal of the third diode assembly 430 to be present at the first terminal of the fifth diode assembly 454 thereby forward biasing the fifth diode assembly. As a result, the second comparator 446 causes a logic high value to be present at the negative EOS gate drive node $V_{GATE, N}$ (e.g., to the first output of the passive gate driver 114, the gate terminal of the first shunt switch 116, etc.). Also, because the first diode assembly 406 is not forward biased, a logic low value is present at the positive EOS drive node $V_{GATE, P}$ (e.g., to the second output of the passive gate driver 114, the gate terminal of the second shunt switch 118, etc.). In this manner, during a negative EOS event, the second comparator 446 causes the first shunt switch 116 to conduct thereby causing current resulting from the negative EOS event to flow through the third diode 122, the first shunt switch 116, the second fuse 308, and the first fuse 302 to the input voltage node $V_{IN}$. In this manner, the passive gate driver 114 advantageously prevents current resulting from the negative EOS event from potentially damaging the eFuse 124.

Also, as described in connection with FIG. 5, during a negative EOS event, current does not flow from the second terminal of the first diode assembly 406 to the first terminal of the first diode assembly 406. In this manner, no discernible voltage is present at either the non-inverting input or the inverting input of the first comparator 422. Accordingly, the first comparator 422 outputs a logic low value, disabling (e.g., opening) the first driver switch 426 and causing the first inverter 424 to enable (e.g., close) the second driver switch 428. By enabling (e.g., closing) the second driver switch 428, the first comparator 422 causes a logic low value to be present at the positive EOS gate drive node $V_{GATE, P}$ (e.g., to the second output of the passive gate driver 114, the gate terminal of the second shunt switch 118, etc.). In this manner, during a negative EOS event, the first comparator 422 advantageously prevents the second shunt switch 118 from conducting.

Figure 5:
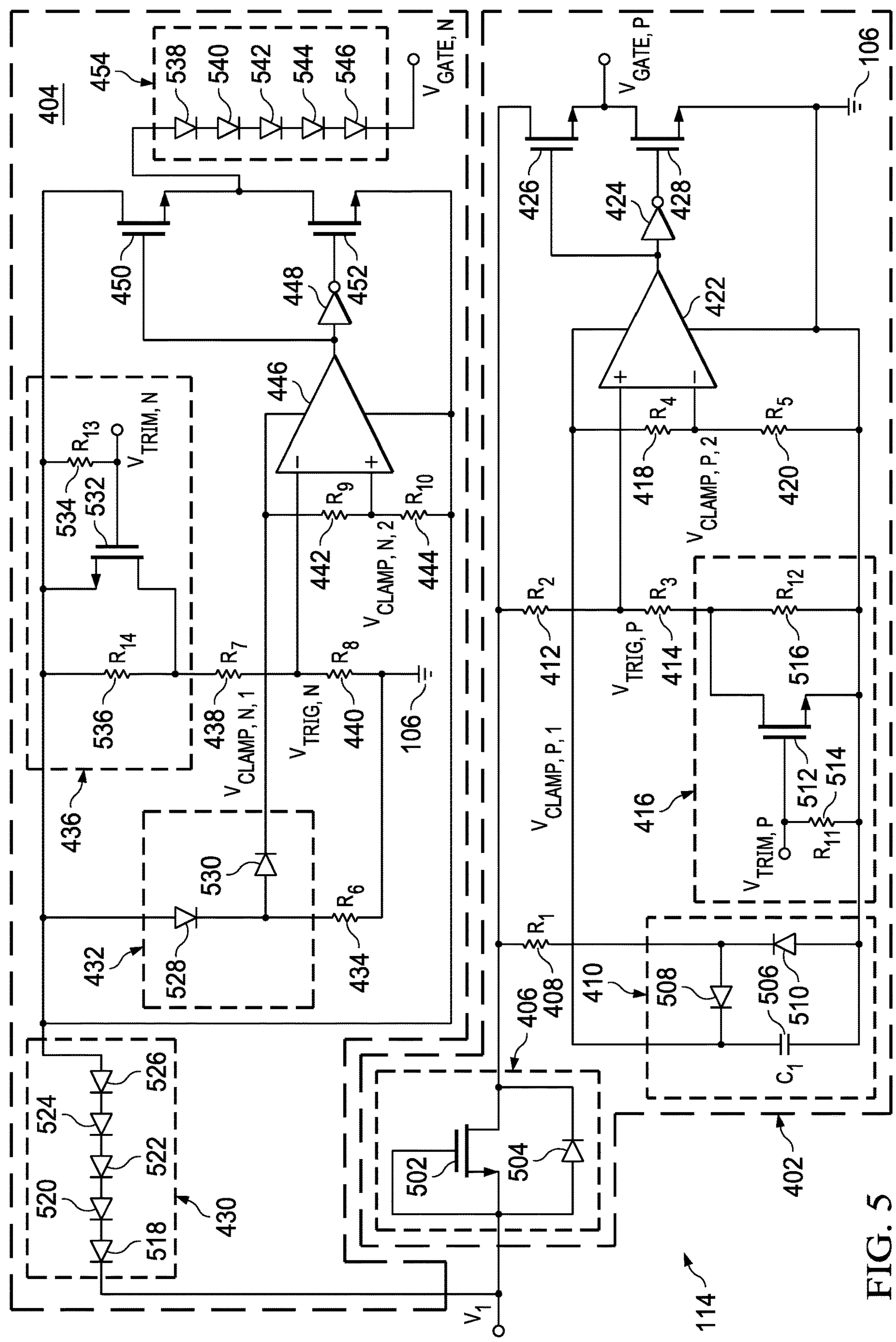
FIG. 5 is a schematic illustration showing additional detail of the passive gate driver of FIG. 4.

FIG. 5 is a schematic illustration showing additional detail of the passive gate driver 114 of FIG. 4. In the example of FIG. 5, the example passive gate driver 114 includes the example positive gate driver 402 and the example negative gate driver 404. In the example of FIG. 5, the example positive gate driver 402 includes the example ground terminal 106, the example first diode assembly 406, the example first resistor 408, $R_1$, the example second diode assembly 410, the example second resistor 412, $R_2$, the example third resistor 414, $R_3$, the example first potentiometer 416, $R_{P1}$, the example fourth resistor 418, $R_4$, the example fifth resistor 420, $R_5$, the example first comparator 422, the example first inverter 424, the example first driver switch 426, and the example second driver switch 428.

In the illustrated example of FIG. 5, the example negative gate driver 404 includes the example ground terminal 106, the example third diode assembly 430, the example fourth diode assembly 432, the example sixth resistor 434, $R_6$, the example second potentiometer 436, $R_{P2}$, the example seventh resistor 438, $R_7$, the example eighth resistor 440, $R_8$, the example ninth resistor 442, $R_9$, the example tenth resistor 444, $R_{10}$, the example second comparator 446, the example second inverter 448, the example third driver switch 450, the example fourth driver switch 452, and the example fifth diode assembly 454.

In the illustrated example of FIG. 5, the example first diode assembly 406 includes an example first switch 502 and an example first diode 504. In the example of FIG. 5, the example second diode assembly 410 includes an example capacitor 506, $C_1$, an example second diode 508, and an example third diode 510. In the example of FIG. 5, the first potentiometer 416, $R_{P1}$, includes an example second switch 512, an example eleventh resistor 514, $R_{11}$, and an example twelfth resistor 516, $R_{12}$.

In the illustrated example of FIG. 5, the third diode assembly 430 includes an example fourth diode 518, an example fifth diode 520, an example sixth diode 522, an example seventh diode 524, and an example eighth diode 526. In the example of FIG. 5, the fourth diode assembly 432 includes an example ninth diode 528 and an example tenth diode 530. In the example of FIG. 5, the second potentiometer 436, $R_{P2}$, includes an example third switch 532, an example thirteenth resistor 534, $R_{13}$, and an example fourteenth resistor 536, $R_{14}$. The example fifth diode assembly 454 includes an example eleventh diode 538, an example twelfth diode 540, an example thirteenth diode 542, an example fourteenth diode 544, and an example fifteenth diode 546.

In the illustrated example of FIG. 5, each of the first switch 502, the second switch 512, and the third switch 532 is implemented by an N-channel MOSFET including an example gate terminal, an example drain terminal, and an example source terminal. In the example of FIG. 5, each of the first diode 504, the second diode 508, the third diode 510, the fourth diode 518, the fifth diode 520, the sixth diode 522, the seventh diode 524, the eighth diode 526, the ninth diode 528, the tenth diode 530, the eleventh diode 538, the twelfth diode 540, the thirteenth diode 542, the fourteenth diode 544, and the fifteenth diode 546 includes an anode and a cathode. In the example of FIG. 5, the capacitor 506, $C_1$, includes a first terminal and a second terminal. In the example of FIG. 5, each of the eleventh resistor 514, $R_{11}$, the twelfth resistor 516, $R_{12}$, the thirteenth resistor 534, $R_{13}$, and the fourteenth resistor 536, $R_{14}$, includes a first terminal and a second terminal.

In the illustrated example of FIG. 5, the first switch 502 is implemented by an LDMOS FET rated for 65 V. In additional or alternative examples, the first switch 502 can be implemented by any number of suitable transistors for a desired application. The gate terminal of the first switch 502 is coupled to the source terminal of the first switch 502, the anode of the first diode 504, the first voltage node $V_1$ and the cathode of the fourth diode 518. The drain terminal of the first switch 502 is coupled to the cathode of the first diode 504, the first terminal of the first resistor 408, $R_1$, the first terminal of the second resistor 412, $R_2$, and the drain terminal of the first driver switch 426. In the example of FIG. 5, the drain terminal of the first switch 502 corresponds to the second terminal of the first diode assembly 406. The source terminal of the first switch 502 is coupled to the gate terminal of the first switch 502, the anode of the first diode 504, the first voltage node $V_1$ and the cathode of the fourth diode 518. In the example of FIG. 5, the source terminal of the first switch 502 corresponds to the first terminal of the first diode assembly 406.

In the illustrated example of FIG. 5, the first diode 504 is implemented as a parasitic diode to the first switch 502. Accordingly, the first diode 504 is rated for 65 V. In additional or alternative examples, the first diode 504 can be implemented by any number of suitable circuit components, such as diode that is separate from the first switch 502. In the example of FIG. 5, the anode of the first diode 504 is coupled to the gate terminal of the first switch 502, the drain terminal of the first switch 502, the first voltage node $V_1$, and the cathode of the fourth diode 518. In the example of FIG. 5, the anode of the first diode 504 corresponds to the first terminal of the first diode assembly 406. The cathode of the first diode 504 is coupled to drain of the first switch 502, the first terminal of the first resistor 408, $R_1$, the first terminal of the second resistor 412, $R_2$, and the drain terminal of the first driver switch 426. In the example of FIG. 5, the cathode of the first diode 504 corresponds to the second terminal of the first diode assembly 406.

In the illustrated example of FIG. 5, the first switch 502 is configured such that it will not conduct current within the SOA of the first switch 502. However, the first diode 504 is coupled in parallel to the first switch 502. In this manner, the first diode 504 conducts current during positive EOS events that forward biases the first diode 504 and blocks the flow of current during negative EOS events (e.g., negative EOS events that do not forward bias and/or reverse bias the first diode 504).

In the illustrated example of FIG. 5, the capacitor 506, $C_1$, is implemented by a capacitor configured to charge between 5 V and 6 V to establish the first positive clamp voltage $V_{CLAMP,\ P,\ 1}$. The first terminal of the capacitor 506, $C_1$, is coupled to the cathode of the second diode 508, the first terminal of the fourth resistor 418, $R_4$, and the positive supply input of the first comparator 422. In the example of FIG. 5, the first terminal of the capacitor 506, $C_1$, corresponds to the second terminal of the second diode assembly 410. The second terminal of the capacitor 506, $C_1$, is coupled to the ground terminal 106, the anode of the third diode 510, the source terminal of the second switch 512, the second terminal of the eleventh resistor 514, $R_{11}$, the second terminal of the twelfth resistor 516, $R_{12}$, the second terminal of the fifth resistor 420, $R_5$, the negative supply input of the first comparator 422, and the source terminal of the second driver switch 428. In the example of FIG. 5, the second terminal of the capacitor 506, $C_1$, corresponds to the first terminal of the second diode assembly 410.

In the illustrated example of FIG. 5, the second diode 508 is implemented by a diode rated for 6 V. The anode of the second diode 508 is coupled to the second terminal of the first resistor 408, $R_1$, and the cathode of the third diode 510. In the example of FIG. 5, the anode of the second diode 508 corresponds to the third terminal of the second diode assembly 410. The cathode of the second diode 508 is coupled to the first terminal of the capacitor 506, $C_1$, the first terminal of the fourth resistor 418, $R_4$, and the positive supply input of the first comparator 422. In the example of FIG. 5, the cathode of the second diode 508 corresponds to the second terminal of the second diode assembly 410.

In the illustrated example of FIG. 5, the third diode 510 is implemented by a diode rated for 6 V. The anode of the third diode 510 is coupled to the ground terminal 106, the second terminal of the capacitor 506, $C_1$, the source terminal of the second switch 512, the second terminal of the eleventh resistor 514, $R_{11}$, the second terminal of the twelfth resistor 516, $R_{12}$, the second terminal of the fifth resistor 420, $R_5$, the negative supply input of the first comparator 422, and the source terminal of the second driver switch 428. In the example of FIG. 5, the anode of the third diode 510 corresponds to the first terminal of the second diode assembly 410. The cathode of the third diode 510 is coupled to the anode of the second diode 508 and the second terminal of the first resistor 408, $R_1$. In the example of FIG. 5, the cathode of the third diode 510 corresponds to the third terminal of the second diode assembly 410.

In the illustrated example of FIG. 5, during a positive EOS event, the third diode 510 clamps the voltage at the second terminal of the first resistor 408, $R_1$, the anode of the second diode 508, and the cathode of the third diode 510 to approximately 6 V. The voltage at the anode of the second diode 508 causes the second diode 508 to be forward biased and reduces the voltage at the first terminal of the capacitor 506, $C_1$, to between 5 V and 6 V (e.g., approximately 5.3 V). In this manner, the capacitor 506, $C_1$, charges during a positive EOS event to establish the first positive clamp voltage $V_{CLAMP,\ P,\ 1}$. As described above, the first diode 504 is coupled in parallel to the first switch 502. In this manner, the first diode 504 conducts current during a positive EOS event and blocks the flow of current during negative EOS events.

In the illustrated example of FIG. 5, the second switch 512 is implemented by an N-channel MOSFET. In additional or alternative examples, the second switch 512 can be implemented by any number of suitable transistors for a desired application. The gate terminal of the second switch 512 is coupled to a positive voltage trimming node $V_{TRIM,\ P}$ and the first terminal of the eleventh resistor 514, $R_{11}$. The drain terminal of the second switch 512 is coupled to the second terminal of the third resistor 414, $R_3$, and the first terminal of the twelfth resistor 516, $R_{12}$. In the example of FIG. 5, the drain terminal of the second switch 512 corresponds to the first terminal of the first potentiometer 416, $R_{P1}$. The source terminal of the second switch 512 is coupled to the ground terminal 106, the second terminal of the capacitor 506, $C_1$, the anode of the third diode 510, the second terminal of the eleventh resistor 514, $R_{11}$, the second terminal of the twelfth resistor 516, $R_{12}$, the second terminal of the fifth resistor 420, $R_5$, the negative supply input of the first comparator 422, and the source terminal of the second driver switch 428. In the example of FIG. 5, the source terminal of the second switch 512 corresponds to the second terminal of the first potentiometer 416, $R_{P1}$.

In the illustrated example of FIG. 5, the first terminal of the eleventh resistor 514, $R_{11}$, is coupled to the positive voltage trimming node $V_{TRIM,\ P}$ and the gate terminal of the second switch 512. The second terminal of the eleventh resistor 514, $R_{11}$, is coupled to the ground terminal 106, the second terminal of the capacitor 506, $C_1$, the anode of the third diode 510, the source terminal of the second switch 512, the second terminal of the twelfth resistor 516, $R_{12}$, the second terminal of the fifth resistor 420, $R_5$, the negative supply input of the first comparator 422, and the source terminal of the second driver switch 428. In the example of FIG. 5, the second terminal of the eleventh resistor 514, $R_{11}$, corresponds to the second terminal of the first potentiometer 416, $R_{P1}$.

In the illustrated example of FIG. 5, the first terminal of the twelfth resistor 516, $R_{12}$, is coupled to the drain terminal of the second switch 512 and the second terminal of the third resistor 414, $R_3$. In the example of FIG. 5, the first terminal of the twelfth resistor 516, $R_{12}$, corresponds to the first terminal of the first potentiometer 416, $R_{P1}$. In the example of FIG. 5, the second terminal of the twelfth resistor 516, $R_{12}$, is coupled to the ground terminal 106, the second terminal of the capacitor 506, $C_1$, the anode of the third diode 510, the source terminal of the second switch 512, the second terminal of the eleventh resistor 514, $R_{11}$, the second terminal of the fifth resistor 420, $R_5$, the negative supply input of the first comparator 422, and the source terminal of the second driver switch 428. In the example of FIG. 5, the second terminal of the twelfth resistor 516, $R_{12}$, corresponds to the second terminal of the first potentiometer 416, $R_{P1}$.

In the illustrated example of FIG. 5, the eleventh resistor 514, $R_{11}$, is coupled in parallel with the gate and source of the second switch 512. Also, the twelfth resistor 516, $R_{12}$, is coupled in parallel with the drain and source of the second switch 512. In this manner, by changing the voltage at the positive voltage trimming node $V_{TRIM,\ P}$, the second switch 512 can be dynamically enabled (e.g., closed) and/or disabled (e.g., opened). Accordingly, the by changing the voltage at the positive voltage trimming node $V_{TRIM,\ P}$, the voltage across the twelfth resistor 516, $R_{12}$, can be adjusted to trim the voltage divider network including the second resistor 412, $R_2$, the third resistor 414, $R_3$, and the first potentiometer 416, $R_{P1}$. For example, by changing the voltage at the positive voltage trimming node $V_{TRIM,\ P}$, the positive trigger voltage $V_{TRIG,\ P}$ can be increased and/or decreased.

In the illustrated example of FIG. 5, the fourth diode 518 is implemented by a diode rated for 12 V. The anode of the fourth diode 518 is coupled to the cathode of the fifth diode 520. The cathode of the fourth diode 518 is coupled to the gate terminal of the first switch 502, the source terminal of the first switch 502, the anode of the first diode 504, and the first voltage node $V_1$. In the example of FIG. 5, the cathode of the fourth diode 518 corresponds to the second terminal of the third diode assembly 430.

In the illustrated example of FIG. 5, the fifth diode 520 is implemented by a diode rated for 12 V. The anode of the fifth diode 520 is coupled to the cathode of the sixth diode 522. The cathode of the fifth diode 520 is coupled to the anode of the fourth diode 518. In the example of FIG. 5, the sixth diode 522 is implemented by a diode rated for 12 V. The anode of the sixth diode 522 is coupled to the cathode of the seventh diode 524. The cathode of the sixth diode 522 is coupled to the anode of the fifth diode 520.

In the illustrated example of FIG. 5, the seventh diode 524 is implemented by a diode rated for 12 V. The anode of the seventh diode 524 is coupled to the cathode of the eighth diode 526. The cathode of the seventh diode 524 is coupled to the anode of the sixth diode 522. In the example of FIG. 5, the eighth diode 526 is implemented by a diode rated for 12 V. The anode of the eighth diode 526 is coupled to the anode of the ninth diode 528, the source terminal of the third switch 532, the first terminal of the thirteenth resistor 534, $R_{13}$, the first terminal of the fourteenth resistor 536, $R_{14}$, the second terminal of the tenth resistor 444, $R_{10}$, the positive supply input of the second comparator 446, the drain terminal of the third driver switch 450, and the source terminal of the fourth driver switch 452. In the example of FIG. 5, the anode of eighth diode 526 corresponds to the first terminal of the third diode assembly 430. The cathode of the eighth diode 526 is coupled to the anode of the seventh diode 524.

In the illustrated example of FIG. 5, the fourth diode 518, the fifth diode 520, the sixth diode 522, the seventh diode 524, and the eighth diode 526 are configured such that they will not conduct current during positive EOS events or within the SOA of the power path protection device 102. However, during negative EOS events, the voltage at the cathode of the fourth diode 518 (e.g., $-65\ V \le V_1 \le -60\ V$) is significantly below the voltage at the anode of the eighth diode 526 (e.g., 0 V). Accordingly, during negative EOS events, the fourth diode 518, the fifth diode 520, the sixth diode 522, the seventh diode 524, and the eighth diode 526 are forward biased and conduct current. In this manner, the fourth diode 518, the fifth diode 520, the sixth diode 522, the seventh diode 524, and the eighth diode 526 conduct current during negative EOS events that forward biases the fourth diode 518, the fifth diode 520, the sixth diode 522, the seventh diode 524, and the eighth diode 526 and block the flow of current during positive EOS events (e.g., positive EOS events that do not forward bias and/or reverse bias the fourth diode 518, the fifth diode 520, the sixth diode 522, the seventh diode 524, and the eighth diode 526).

In the illustrated example of FIG. 5, the ninth diode 528 is implemented by a diode rated for 6 V. The anode of the ninth diode 528 is coupled to the anode of the eighth diode 526, the source terminal of the third switch 532, the first terminal of the thirteenth resistor 534, $R_{13}$, the first terminal of the fourteenth resistor 536, $R_{10}$, the second terminal of the tenth resistor 444, $R_{10}$, the positive supply input of the second comparator 446, the drain terminal of the third driver switch 450, and the source terminal of the fourth driver switch 452. In the example of FIG. 5, the anode of the ninth diode 528 corresponds to the first terminal of the fourth diode assembly 432. The cathode of the ninth diode 528 is coupled to the anode of the tenth diode 530 and the first terminal of the sixth resistor 434, $R_6$. In the example of FIG. 5, the cathode of the ninth diode 528 corresponds to the second terminal of the fourth diode assembly 432.

In the illustrated example of FIG. 5, the tenth diode 530 is implemented by a diode rated for 6 V. The anode of the tenth diode 530 is coupled to the cathode of the ninth diode 528 and the first terminal of the sixth resistor 434, $R_6$. In the example of FIG. 5, the anode of the tenth diode 530 corresponds to the second terminal of the fourth diode assembly 432. In the example of FIG. 5, the cathode of the tenth diode 530 is coupled to the first terminal of the ninth resistor 442, $R_9$, and the negative supply input of the second comparator 446. In the example of FIG. 5, the cathode of the tenth diode 530 corresponds to the third terminal of the fourth diode assembly 432.

In the illustrated example of FIG. 5, during a negative EOS event, the ninth diode 528 clamps the voltage at the first terminal of the sixth resistor 434, $R_6$, and the anode of the tenth diode 530 to approximately −54 V. The voltage at the anode of the tenth diode 530 causes the tenth diode 530 to be forward biased and reduces the voltage at the first terminal of the ninth resistor 442, $R_9$, and the negative supply input of the second comparator 446 to between −54 V and −55 V (e.g., approximately −54.7 V). In this manner, during a negative EOS event the ninth diode 528 and the tenth diode 530 establish the first negative clamp voltage $V_{CLAMP,\ N,\ 1}$.

In the illustrated example of FIG. 5, the third switch 532 is implemented by an N-channel MOSFET. In additional or alternative examples, the third switch 532 can be implemented by any number of suitable transistors for a desired application. The gate terminal of the third switch 532 is coupled to a negative voltage trimming node $V_{TRIM,\ N}$ and the second terminal of the thirteenth resistor 534, $R_{13}$. The drain terminal of the third switch 532 is coupled to the second terminal of the fourteenth resistor 536, $R_{14}$, and the first terminal of the seventh resistor 438, $R_7$. In the example of FIG. 5, the drain terminal of the third switch 532 corresponds to the second terminal of the second potentiometer 436, $R_{P2}$. In the example of FIG. 5, the source terminal of the third switch 532 is coupled to the anode of the eighth diode 526, the anode of the ninth diode 528, the first terminal of the thirteenth resistor 534, $R_{13}$, the first terminal of the fourteenth resistor 536, $R_{14}$, the second terminal of the tenth resistor 444, $R_{10}$, the positive supply input of the second comparator 446, the drain terminal of the third driver switch 450, and the source terminal of the fourth driver switch 452. In the example of FIG. 5, the source terminal of the third switch 532 corresponds to the first terminal of the second potentiometer 436, $R_{P2}$.

In the illustrated example of FIG. 5, the first terminal of the thirteenth resistor 534, $R_{13}$, is coupled to the anode of the eighth diode 526, the anode of the ninth diode 528, the source terminal of the third switch 532, the first terminal of the fourteenth resistor 536, $R_{14}$, the second terminal of the tenth resistor 444, $R_{10}$, the positive supply input of the second comparator 446, the drain terminal of the third driver switch 450, and the source terminal of the fourth driver switch 452. In the example of FIG. 5, the first terminal of the thirteenth resistor 534, $R_{13}$, corresponds to the first terminal of the second potentiometer 436, $R_{P2}$. The second terminal of the thirteenth resistor 534, $R_{13}$, is coupled to the negative voltage trimming node $V_{TRIM,\ N}$ and the gate terminal of the third switch 532.

In the illustrated example of FIG. 5, the first terminal of the fourteenth resistor 536, $R_{14}$, is coupled to the anode of the eighth diode 526, the anode of the ninth diode 528, the source terminal of the third switch 532, the first terminal of the thirteenth resistor 534, $R_{13}$, the second terminal of the tenth resistor 444, $R_{10}$, the positive supply input of the second comparator 446, the drain terminal of the third driver switch 450, and the source terminal of the fourth driver switch 452. In the example of FIG. 5, the first terminal of the fourteenth resistor 536, $R_{14}$, corresponds to the first terminal of the second potentiometer 436, $R_{P2}$. In the example of FIG. 5, the second terminal of the fourteenth resistor 536, $R_{14}$, is coupled to the drain terminal of the third switch 532 and the first terminal of the seventh resistor 438, $R_7$. In the example of FIG. 5, the second terminal of the fourteenth resistor 536, $R_{14}$, corresponds to the second terminal of the second potentiometer 436, $R_{P2}$.

In the illustrated example of FIG. 5, the thirteenth resistor 534, $R_{13}$, is coupled in parallel with the gate and source of the third switch 532. Also, the fourteenth resistor 536, $R_{14}$, is coupled in parallel with the drain and source of the third switch 532. In this manner, by changing the voltage at the negative voltage trimming node $V_{TRIM,\ N}$, the third switch 532 can be dynamically enabled (e.g., closed) and/or disabled (e.g., opened). Accordingly, the by changing the voltage at the negative voltage trimming node $V_{TRIM,\ N}$, the voltage across the fourteenth resistor 536, $R_{14}$, can be adjusted to trim the voltage divider network including the eighth resistor 440, $R_8$, the seventh resistor 438, $R_7$, and the second potentiometer 436, $R_{P2}$. For example, by changing the voltage at the negative voltage trimming node $V_{TRIM,\ N}$, the negative trigger voltage $V_{TRIG,\ N}$ can be increased and/or decreased.

In the illustrated example of FIG. 5, the eleventh diode 538 is implemented by a diode rated for 12 V. The anode of the eleventh diode 538 is coupled to the source terminal of the third driver switch 450 and the drain terminal of the fourth driver switch 452. In the example of FIG. 5, the anode of the eleventh diode 538 corresponds to the first terminal of the fifth diode assembly 454. The cathode of the eleventh diode 538 is coupled to the anode of the twelfth diode 540.

In the illustrated example of FIG. 5, the twelfth diode 540 is implemented by a diode rated for 12 V. The anode of the twelfth diode 540 is coupled to the cathode of the eleventh diode 538. The cathode of the twelfth diode 540 is coupled to the anode of the thirteenth diode 542. In the example of FIG. 5, the thirteenth diode 542 is implemented by a diode rated for 12 V. The anode of the thirteenth diode 542 is coupled to the cathode of the twelfth diode 540. The cathode of the thirteenth diode 542 is coupled to the anode of the fourteenth diode 544.

In the illustrated example of FIG. 5, the fourteenth diode 544 is implemented by a diode rated for 12 V. The anode of the fourteenth diode 544 is coupled to the cathode of the thirteenth diode 542. The cathode of the fourteenth diode 544 is coupled to the anode of the fifteenth diode 546. In the example of FIG. 5, the fifteenth diode 546 is implemented by a diode rated for 12 V. The anode of the fifteenth diode 546 is coupled to cathode of the fourteenth diode 544. The cathode of the fifteenth diode 546 is coupled to the negative EOS gate drive node $V_{GATE,\ N}$. In the example of FIG. 5, the cathode of fifteenth diode 546 corresponds to the second terminal of the fifth diode assembly 454.

In the illustrated example of FIG. 5, the eleventh diode 538, the twelfth diode 540, the thirteenth diode 542, the fourteenth diode 544, and the fifteenth diode 546 are configured such that they will conduct current during negative EOS events. However, during positive EOS events, the voltage at the cathode of the fifteenth diode 546 (e.g., 60 V≤$V_1$≤65 V) is significantly below the voltage at the anode of the eleventh diode 538 (e.g., 0 V). Accordingly, during positive EOS events, the eleventh diode 538, the twelfth diode 540, the thirteenth diode 542, the fourteenth diode 544, and the fifteenth diode 546 do not conduct current. In this manner, the eleventh diode 538, the twelfth diode 540, the thirteenth diode 542, the fourteenth diode 544, and the fifteenth diode 546 conduct (e.g., provide) current during negative EOS events and block the flow of current during positive EOS events (e.g., protecting at least the fourth driver switch 452).

Figure 6:
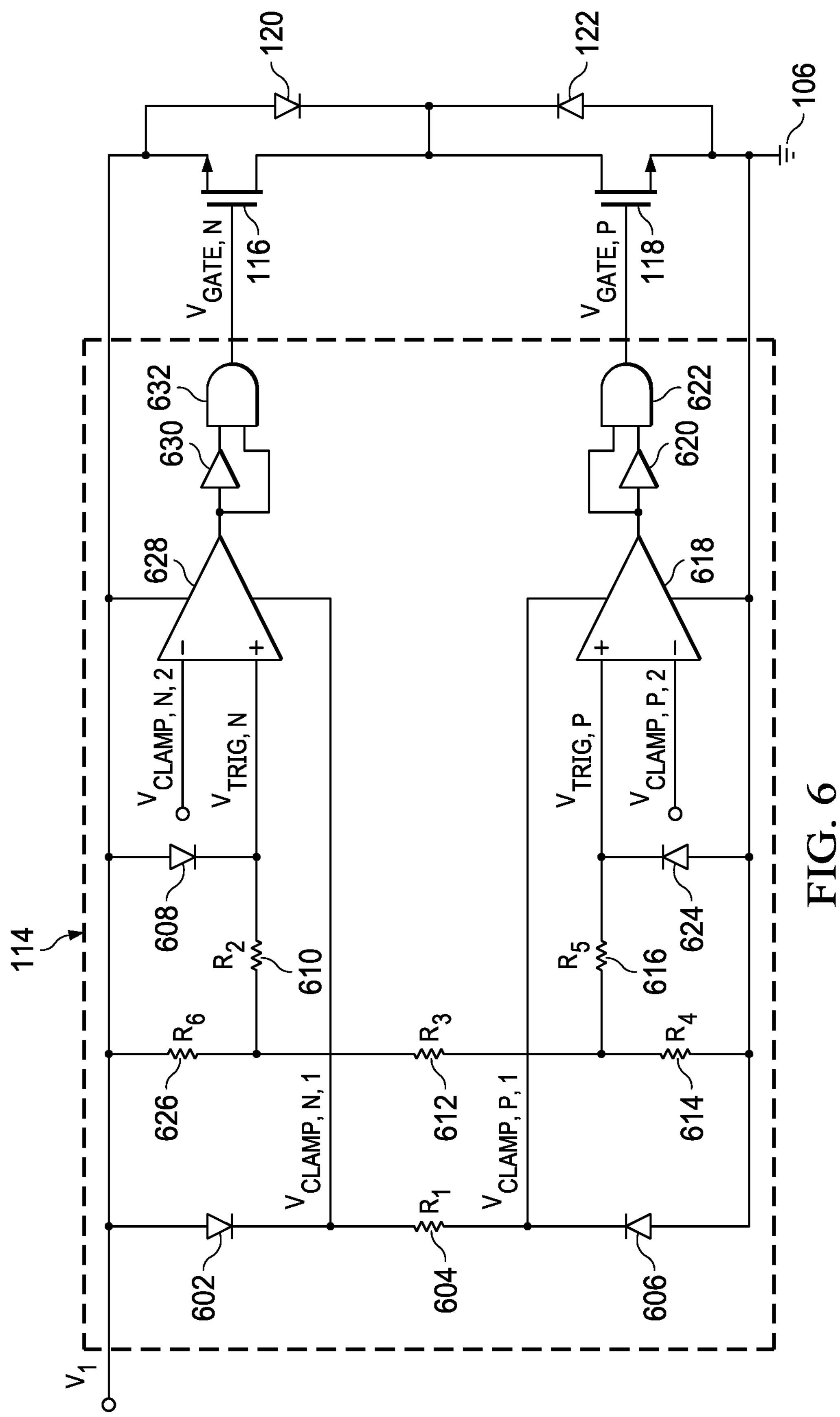
FIG. 6 is a schematic illustration showing an example implementation of the passive gate driver of FIG. 1.

FIG. 6 is a schematic illustration showing an example implementation of the passive gate driver 114 of FIG. 1. In the example of FIG. 6, the example passive gate driver 114 includes the example ground terminal 106, an example first diode 602, an example first resistor 604, $R_1$, an example second diode 606, an example third diode 608, an example second resistor 610, $R_2$, an example third resistor 612, $R_3$, an example fourth resistor 614, $R_4$, an example fifth resistor 616, $R_5$, an example first comparator 618, an example first delay circuit 620, an example first logic gate 622, an example fourth diode 624, an example sixth resistor 626, $R_6$, an example second comparator 628, an example second delay circuit 630, and an example second logic gate 632.

In the illustrated example of FIG. 6, each of the first diode 602, the second diode 606, the third diode 608, and the fourth diode 624 includes an anode and a cathode. In the example of FIG. 6, each of the first resistor 604, $R_1$, the second resistor 610, $R_2$, the third resistor 612, $R_3$, the fourth resistor 614, $R_4$, the fifth resistor 616, $R_5$, and the sixth resistor 626, $R_6$, includes a first terminal and a second terminal. In the example of FIG. 6, each of the first comparator 618 and the second comparator 628 includes a non-inverting input, an inverting input, a positive supply input, a negative supply input, and an output. In the example of FIG. 6, each of the first delay circuit 620 and the second delay circuit 630 includes an input and an output. In the example of FIG. 6, each of the first logic gate 622 and the second logic gate 632 includes a first input, a second input, and an output.

In the illustrated example of FIG. 6, the first diode 602 is implemented by a diode rated for 65 V. In the example of FIG. 6, the anode of the first diode 602 is coupled to the first voltage node $V_1$, the first terminal of the sixth resistor 626, $R_6$, the anode of the third diode 608, the negative supply input of the second comparator 628, the source terminal of the first shunt switch 116, and the anode of the second diode 120. In the example of FIG. 6, the anode of the first diode 602 corresponds to the first input of the passive gate driver 114. In the example of FIG. 6, the cathode of the first diode 602 is coupled to the first terminal of the first resistor 604, $R_1$, and the positive supply input of the second comparator 628 to set the first negative clamp voltage $V_{CLAMP, N, 1}$. In the example of FIG. 6, during positive EOS events, the first diode 602 is forward biased and conducts current. Alternatively, during negative EOS events, the first diode 602 clamps the first negative clamp voltage $V_{CLAMP, N, 1}$ at the cathode of the first diode 602, the first terminal of the first resistor 604, $R_1$, and the positive supply input of the second comparator 628. For example, during negative EOS events, the first diode 602 clamps the first negative clamp voltage $V_{CLAMP, N, 1}$ to be between −55V and −54V.

In the illustrated example of FIG. 6, the first terminal of the first resistor 604, $R_1$, is coupled to the cathode of the first diode 602 and the positive supply input of the second comparator 628 to set the first negative clamp voltage $V_{CLAMP, N, 1}$. The second terminal of the first resistor 604, $R_1$, is coupled to the cathode of the second diode 606 and the positive supply input of the first comparator 618 to set the first positive clamp voltage $V_{CLAMP, P, 1}$. In the example of FIG. 6, the resistance of the first resistor 604, $R_1$, is configured such that the voltage drop across the first resistor 604, $R_1$, during a positive EOS event will cause the first positive clamp voltage $V_{CLAMP, P, 1}$ to be between 5V and 6V. Also, the resistance of the first resistor 604, $R_1$, is configured such that the voltage drop across the first resistor 604, $R_1$, during a negative EOS event will cause the first negative clamp voltage $V_{CLAMP, N, 1}$ to be between −55V and −54V.

In the illustrated example of FIG. 6, the second diode 606 is implemented by a diode rated for 65 V. In the example of FIG. 6, the anode of the second diode 606 is coupled to the ground terminal 106, the second terminal of the fourth resistor 614, $R_4$, the anode of the fourth diode 624, the negative supply input of the first comparator 618, the source terminal of the second shunt switch 118, and the anode of the third diode 122. In the example of FIG. 6, the cathode of the second diode 606 is coupled to the second terminal of the first resistor 604, $R_1$, and the positive supply input of the first comparator 618 to set the first positive clamp voltage $V_{CLAMP, P, 1}$. In the example of FIG. 6, during positive EOS events, the second diode 606 clamps the first positive clamp voltage $V_{CLAMP, P, 1}$ at the cathode of the second diode 606, the second terminal of the first resistor 604, $R_1$, and the positive supply input of the first comparator 618. For example, during positive EOS events, the second diode 606 clamps the first positive clamp voltage $V_{CLAMP, P, 1}$ to be between 5V and 6V. Alternatively, during negative EOS events, the second diode 606 is forward biased and conducts current.

In the illustrated example of FIG. 6, the third diode 608 is implemented by a diode rated for 65 V. In the example of FIG. 6, the anode of the third diode 608 is coupled to the first voltage node $V_1$, the anode of the first diode 602, the first terminal of the sixth resistor 626, $R_6$, the negative supply input of the second comparator 628, the source terminal of the first shunt switch 116, and the anode of the second diode 120. In the example of FIG. 6, the anode of the third diode 608 corresponds to the first input of the passive gate driver 114. In the example of FIG. 6, the cathode of the third diode 608 is coupled to the second terminal of the second resistor 610, $R_2$, and the non-inverting input of the second comparator 628. In the example of FIG. 6, during positive EOS events, the third diode 608 is forward biased and conducts current. For example, during positive EOS events, the third diode 608 is part of a voltage divider network including the third diode 608, the second resistor 610, $R_2$, the third resistor 612, $R_3$, and the fourth resistor 614, $R_4$. Alternatively, during negative EOS events, the third diode 608 is not forward biased and blocks the flow of current.

In the illustrated example of FIG. 6, the first terminal of the second resistor 610, $R_2$, is coupled to the first terminal of the third resistor 612, $R_3$, and the second terminal of the sixth resistor 626, $R_6$. The second terminal of the second resistor 610, $R_2$, is coupled to the cathode of the third diode 608 and the non-inverting input of the second comparator 628. During positive EOS events, the second resistor 610, $R_2$, is part of a voltage divider network including the third diode 608, the second resistor 610, $R_2$, the third resistor 612, $R_3$, and the fourth resistor 614, $R_4$. During negative EOS events, the second resistor 610, $R_2$, receives the voltage output from a voltage divider network including the fourth diode 624, the fifth resistor 616, $R_5$, the third resistor 612, $R_3$, and the sixth resistor 626, $R_6$, to scale the negative trigger voltage $V_{TRIG, N}$ to a voltage that is compatible with the second comparator 628.

In the illustrated example of FIG. 6, the first terminal of the third resistor 612, $R_3$, is coupled the first terminal of the second resistor 610, $R_2$, and the second terminal of the sixth resistor 626, $R_6$. In the example of FIG. 6, the second terminal of the third resistor 612, $R_3$, is coupled to the first terminal of the fourth resistor 614, $R_4$, and the first terminal of the fifth resistor 616, $R_5$. During positive EOS events, the third resistor 612, $R_3$, is part of the voltage divider network including the third diode 608, the second resistor 610, $R_2$, the third resistor 612, $R_3$, and the fourth resistor 614, $R_4$, to scale the positive trigger voltage $V_{TRIG, P}$ to a voltage that is compatible with the first comparator 618. During negative EOS events, the third resistor 612, $R_3$, is part of a voltage divider network including the fourth diode 624, the fifth resistor 616, $R_5$, the third resistor 612, $R_3$, and the sixth resistor 626, $R_6$, to scale the negative trigger voltage $V_{TRIG, N}$ to a voltage that is compatible with the second comparator 628.

In the illustrated example of FIG. 6, the first terminal of the fourth resistor 614, $R_4$, is coupled to the second terminal of the third resistor 612, $R_3$, and the first terminal of the fifth resistor 616, $R_5$. In the example of FIG. 6, the second terminal of the fourth resistor 614, $R_4$, is coupled to the ground terminal 106, the anode of the second diode 606, the anode of the fourth diode 624, the negative supply input of the first comparator 618, the source terminal of the second shunt switch 118, and the anode of the third diode 122. During positive EOS events, the fourth resistor 614, $R_4$, is part of the voltage divider network including the third diode 608, the second resistor 610, $R_2$, the third resistor 612, $R_3$, and the fourth resistor 614, $R_4$, to scale the positive trigger voltage $V_{TRIG, P}$ to a voltage that is compatible with the first comparator 618.

In the illustrated example of FIG. 6, the first terminal of the fifth resistor 616, $R_5$, is coupled to the first terminal of the fourth resistor 614, $R_4$, and the second terminal of the third resistor 612, $R_3$. The second terminal of the fifth resistor 616, $R_5$, is coupled to the cathode of the fourth diode 624 and the non-inverting input of the first comparator 618. During positive EOS events, the fifth resistor 616, $R_5$, receives the voltage output from the voltage divider network including the third diode 608, the second resistor 610, $R_2$, the third resistor 612, $R_3$, and the fourth resistor 614, $R_4$, to scale the positive trigger voltage $V_{TRIG, P}$ to a voltage that is compatible with the first comparator 618. For example, the positive trigger voltage $V_{TRIG, P}$ is equal to the difference between: (a) the product of (i) the voltage at the first voltage node $V_1$ minus the voltage drop across the third diode 608 and (ii) the quotient of (1) the resistance of the fourth resistor 614, $R_4$, and (2) the sum of the resistance of the second resistor 610, $R_2$, the resistance of the third resistor 612, $R_3$, and the resistance of the fourth resistor 614, $R_4$; and (b) the voltage drop across the fifth resistor 616, $R_5$ (e.g., $V_{TRIG, P}=(V_1-V_{608})*R_4/R_2+R_3+R_4-V_{616}$). During negative EOS events, the fifth resistor 616, $R_5$, is part of a voltage divider network including the fourth diode 624, the fifth resistor 616, $R_5$, the third resistor 612, $R_3$, and the sixth resistor 626, $R_6$.

In the illustrated example of FIG. 6, the non-inverting input of the first comparator 618 is coupled to the second terminal of the fifth resistor 616, $R_5$, and the cathode of the fourth diode 624 to receive the positive trigger voltage $V_{TRIG, P}$. The inverting input of the first comparator 618 receives the second positive clamp voltage $V_{CLAMP, P, 2}$. In the example of FIG. 6, the second positive clamp voltage $V_{CLAMP, P, 2}$ is configured to be half of the second positive clamp voltage $V_{CLAMP, P, 2}$ (e.g., $2.5V \leq V_{CLAMP, P, 2} \leq 3V$). For example, the inverting input of the first comparator 618 can receive the second positive clamp voltage $V_{CLAMP, P, 2}$ via a voltage divider network as illustrated and described in connection with FIG. 4. The positive supply input of first comparator 618 is coupled to the second terminal of the first resistor 604, $R_1$, and the cathode of the second diode 606. The negative supply input of the first comparator 618 is coupled to the ground terminal 106, the anode of the second diode 606, the second terminal of the fourth resistor 614, $R_4$, the anode of the fourth diode 624, the source terminal of the second shunt switch 118, and the anode of the third diode 122. The output of the first comparator 618 is coupled to the input of the first delay circuit 620 and the first input of the first logic gate 622.

In the illustrated example of FIG. 6, the first comparator 618 is implemented by an operational amplifier. In additional or alternative examples, the first comparator 618 can be implemented by any number of logic gates, comparators, triggers (e.g., Schmitt triggers) and/or any other suitable circuit component for a desired application. In the example of FIG. 6, the quiescent current of the first comparator 618 is 2 μA. In the example of FIG. 6, the first comparator 618 monitors the positive trigger voltage $V_{TRIG, P}$ to determine whether the positive trigger voltage $V_{TRIG, P}$ is greater than the second positive clamp voltage $V_{CLAMP, P, 2}$. Responsive to determining that the positive trigger voltage $V_{TRIG, P}$ has exceeded the second positive clamp voltage $V_{CLAMP, P, 2}$ (e.g., $2.5\ V \leq V_{TRIG, P} \leq 3\ V$), the first comparator 618 outputs a logic high value (e.g., a binary 1, a 5 V signal, etc.). In examples described herein, the positive trigger voltage $V_{TRIG, P}$ exceeding the second positive clamp voltage $V_{CLAMP, P, 2}$ is indicative of the voltage at the first voltage node VI exceeding 55 V. Responsive to determining that the positive trigger voltage $V_{TRIG, P}$ has not exceeded the second positive clamp voltage $V_{CLAMP, P, 2}$, the first comparator 618 outputs a logic low value (e.g., a binary 0, a 0 V signal, etc.). In this manner, when the voltage at the first voltage node VI exceeds an absolute value of 55 V, the first comparator 618 outputs a logic high value.

In the illustrated example of FIG. 6, the input of the first delay circuit 620 is coupled to the output of the first comparator 618 and the first input of the first logic gate 622. The output of the first delay circuit 620 is coupled to the second input of the first logic gate 622. In the example of FIG. 6, the first delay circuit 620 is implemented by a buffer. In additional or alternative examples, the first delay circuit 620 can be implemented by any number of suitable circuit components for a desired application, such as one or more MOSFETs. In the example of FIG. 6, the delay of the first delay circuit 620 is approximately 50 μs. In this manner, the first delay circuit 620 allows the passive gate driver 114 to distinguish between electrical overstress (EOS) events (e.g., lasting longer than or equal to 50 μs) and surge events (e.g., lasting less than 50 μs).

In the illustrated example of FIG. 6, the first input of the first logic gate 622 is coupled to the output of the first comparator 618 and the input of the first delay circuit 620. The second input of the first logic gate 622 is coupled to the output of the first delay circuit 620. The output of the first logic gate 622 is coupled to the gate terminal of the second shunt switch 118 at the positive EOS gate drive node $V_{GATE, P}$. In the example of FIG. 6, the output of the first logic gate 622 corresponds to the second output of the passive gate driver 114.

In the illustrated example of FIG. 6, the first logic gate 622 is implemented by an AND gate. In additional or alternative examples, the first logic gate 622 can be implemented by any number of suitable circuit components for a desired application, such as one or more MOSFETs. In the example of FIG. 6, when the first logic gate 622 receives a logic high value at the first input and a logic high value at the second input, the first logic gate 622 outputs a logic high value. Any other combination of logic values will result in the first logic gate 622 outputting a logic low value. Accordingly, during a positive surge event, the first logic gate 622 will not output a logic high value. As a result, the second shunt switch 118 will not be enabled (e.g., will be open). However, during a positive EOS event, the first logic gate 622 will output a logic high value and cause the second shunt switch 118 to be enabled (e.g., closed).

In the illustrated example of FIG. 6, the fourth diode 624 is implemented by a diode rated for 65 V. In the example of FIG. 6, the anode of the fourth diode 624 is coupled to the ground terminal 106, the anode of the second diode 606, the second terminal of the fourth resistor 614, $R_4$, the negative supply input of the first comparator 618, the source terminal of the second shunt switch 118, and the anode of the third diode 122. In the example of FIG. 6, the cathode of the fourth diode 624 is coupled to the second terminal of the fifth resistor 616 $R_5$, and the non-inverting input of the first comparator 618. In the example of FIG. 6, during negative EOS events, the fourth diode 624 is forward biased and conducts current. For example, during negative EOS events, the fourth diode 624 is part of a voltage divider network including the fourth diode 624, the fifth resistor 616, $R_5$, the third resistor 612, $R_3$, and the sixth resistor 626, $R_6$. Alternatively, during positive EOS events, the fourth diode 624 is not forward biased and blocks the flow of current.

In the illustrated example of FIG. 6, the first terminal of the sixth resistor 626, $R_6$, is coupled to the first voltage node $V_1$, the anode of the first diode 602, the first terminal of the sixth resistor 626, $R_6$, the negative supply input of the second comparator 628, the source terminal of the first shunt switch 116, and the anode of the second diode 120. In the example of FIG. 6, the second terminal of the sixth resistor 626, $R_6$, is coupled to the first terminal of the second resistor 610, $R_2$, and the first terminal of the third resistor 612, $R_3$. During negative EOS events, the sixth resistor 626, $R_6$, is part of the voltage divider network including the fourth diode 624, the fifth resistor 616, $R_5$, the third resistor 612, $R_3$, and the sixth resistor 626, $R_6$, to scale the negative trigger voltage $V_{TRIG, N}$ to a voltage that is compatible with the second comparator 628. For example, the negative trigger voltage $V_{TRIG, N}$ is equal to the difference between: (a) the product of (i) the voltage at the ground terminal 106 minus the sum of the voltage at the first voltage node $V_1$ and the voltage drop across the fourth diode 624 and (ii) the quotient of (1) the resistance of the sixth resistor 626, $R_6$, and (2) the sum of the resistance of the fifth resistor 616, $R_5$, the resistance of the third resistor 612, $R_3$, and the resistance of the sixth resistor 626, $R_6$; and (b) the voltage drop across the second resistor 610, $$R_2 \left(\text{e.g., } V_{TRIG,N} = (0 - V_1 + V_{624}) * \frac{R_6}{R_3 + R_5 + R_6} - V_{610}\right).$$

In the illustrated example of FIG. 6, the non-inverting input of the second comparator 628 is coupled to the second terminal of the second resistor 610, $R_2$, and the cathode of the third diode 608 to receive the negative trigger voltage $V_{TRIG, N}$. The inverting input of the second comparator 628 receives the second negative clamp voltage $V_{CLAMP, N, 2}$. In the example of FIG. 6, the second negative clamp voltage $V_{CLAMP, N, 2}$ is configured to be half of the difference between the second negative clamp voltage $V_{CLAMP, N, 2}$ and the voltage at the first voltage node $V_1$ (e.g., $-57.5V \leq V_{CLAMP, N, 2} \leq -57V$). For example, the inverting input of the second comparator 628 can receive the second negative clamp voltage $V_{CLAMP, N, 2}$ via a voltage divider network as illustrated and described in connection with FIG. 4. The positive supply input of second comparator 628 is coupled to the cathode of the first diode 602 and the first terminal of the first resistor 604, $R_1$. The negative supply input of the second comparator 628 is coupled to the first voltage node $V_1$, the anode of the first diode 602, the first terminal of the sixth resistor 626, $R_6$, the anode of the third diode 608, the source terminal of the first shunt switch 116, and the anode of the second diode 120. The output of the second comparator 628 is coupled to the input of the second delay circuit 630 and the second input of the second logic gate 632.

In the illustrated example of FIG. 6, the second comparator 628 is implemented by an operational amplifier. In additional or alternative examples, the second comparator 628 can be implemented by any number of logic gates, comparators, triggers (e.g., Schmitt triggers) and/or any other suitable circuit component for a desired application. In the example of FIG. 6, the quiescent current of the second comparator 628 is 2 μA. In the example of FIG. 6, the second comparator 628 monitors the negative trigger voltage $V_{TRIG, N}$ to determine whether the negative trigger voltage $V_{TRIG, N}$ is greater than the second negative clamp voltage $V_{CLAMP, N, 2}$. Responsive to determining that the negative trigger voltage $V_{TRIG, N}$ has exceeded the second negative clamp voltage $V_{CLAMP, N, 2}$ (e.g., $-57.5V \leq V_{TRIG, N} \leq -57V$), the second comparator 628 outputs a logic high value (e.g., a binary 1, a 5 V signal, etc.). In examples described herein, the negative trigger voltage $V_{TRIG, N}$ exceeding the second negative clamp voltage $V_{CLAMP, N, 2}$ is indicative of the voltage at the first voltage node $V_1$ exceeding −55 V. Responsive to determining that the negative trigger voltage $V_{TRIG, N}$ has not exceeded the second negative clamp voltage $V_{CLAMP, N, 2}$, the second comparator 628 outputs a logic low value (e.g., a binary 0, a 0 V signal, etc.). In this manner, when the voltage at the first voltage node $V_1$ exceeds an absolute value of 55 V, the second comparator 628 outputs a logic high value.

In the illustrated example of FIG. 6, the input of the second delay circuit 630 is coupled to the output of the second comparator 628 and the second input of the second logic gate 632. The output of the second delay circuit 630 is coupled to the first input of the second logic gate 632. In the example of FIG. 6, the second delay circuit 630 is implemented by a buffer. In additional or alternative examples, the second delay circuit 630 can be implemented by any number of suitable circuit components for a desired application, such as one or more MOSFETs. In the example of FIG. 6, the delay of the second delay circuit 630 is approximately 50 μs. In this manner, the second delay circuit 630 allows the passive gate driver 114 to distinguish between EOS events (e.g., lasting longer than or equal to 50 μs) and surge events (e.g., lasting less than 50 μs).

In the illustrated example of FIG. 6, the first input of the second logic gate 632 is coupled to the output of the second delay circuit 630. The second input of the second logic gate 632 is coupled to the output of the second comparator 628 and the input of the second delay circuit 630. The output of the second logic gate 632 is coupled to the gate terminal of the first shunt switch 116 at the negative EOS gate drive node $V_{GATE, N}$. In the example of FIG. 6, the output of the second logic gate 632 corresponds to the first output of the passive gate driver 114.

In the illustrated example of FIG. 6, the second logic gate 632 is implemented by an AND gate. In additional or alternative examples, the second logic gate 632 can be implemented by any number of suitable circuit components for a desired application, such as one or more MOSFETs. In the example of FIG. 6, when the second logic gate 632 receives a logic high value at the first input and a logic high value at the second input, the second logic gate 632 outputs a logic high value. Any other combination of logic values will result in the second logic gate 632 outputting a logic low value. Accordingly, during a negative surge event, the second logic gate 632 will not output a logic high value. As a result, the first shunt switch 116 will not be enabled (e.g., will be open). However, during a negative EOS event, the second logic gate 632 will output a logic high value and cause the first shunt switch 116 to be enabled (e.g., closed).

In example operation, the first comparator 618, the second diode 606, the second comparator 628, and the first diode 602 monitor the voltage at the first voltage node $V_1$. Responsive to detecting a positive EOS event (e.g., a voltage greater than or equal to 60 V, etc.), the second diode 606 clamps the first positive clamp voltage $V_{CLAMP, P, 1}$ to between 5V and 6V. Subsequently, the first comparator 618 determines whether the positive trigger voltage $V_{TRIG, P}$ (e.g., indicative of the voltage at the first voltage node $V_1$) is greater than the voltage at the second positive clamp voltage $V_{CLAMP, P, 2}$ (e.g., a positive threshold voltage). For example, the passive gate driver 114 is configured to cause the fuse assembly 112 to fail open during positive EOS events that last longer than 50 μs. Responsive to the positive trigger voltage $V_{TRIG, P}$ being greater than the second positive clamp voltage $V_{CLAMP, P, 2}$, the first comparator 618 causes the second shunt switch 118 to conduct thereby causing current resulting from the positive EOS event to flow through the second diode 120 and the second shunt switch 118 to the ground terminal 106. In this manner, the passive gate driver 114 advantageously prevents current resulting from the positive EOS event from potentially damaging the eFuse 124.

In the illustrated example of FIG. 6, responsive to detecting a negative EOS event (e.g., a voltage less than or equal to −60 V, etc.), the first diode 602 clamps the first negative clamp voltage $V_{CLAMP,\ N,\ 1}$ to between −55V and −54V. Subsequently, the second comparator 628 determines whether the negative trigger voltage $V_{TRIG,\ N}$ (e.g., indicative of the voltage at the first voltage node $V_1$) is less than the voltage at the second negative clamp voltage $V_{CLAMP,\ N,\ 2}$ (e.g., a negative threshold voltage). For example, the passive gate driver 114 is configured to cause the fuse assembly 112 to fail open during negative EOS events that last longer than 50 μs. Responsive to the negative trigger voltage $V_{TRIG,\ N}$ being less than the second negative clamp voltage $V_{CLAMP,\ N,\ 2}$, the second comparator 628 causes the first shunt switch 116 to conduct thereby causing current resulting from the negative EOS event to flow through the third diode 122, the first shunt switch 116, the fuse assembly 112, and the first diode 104 to the input voltage node $V_{IN}$. In this manner, the passive gate driver 114 advantageously prevents current resulting from the negative EOS event from potentially damaging the eFuse 124.

Figure 7:
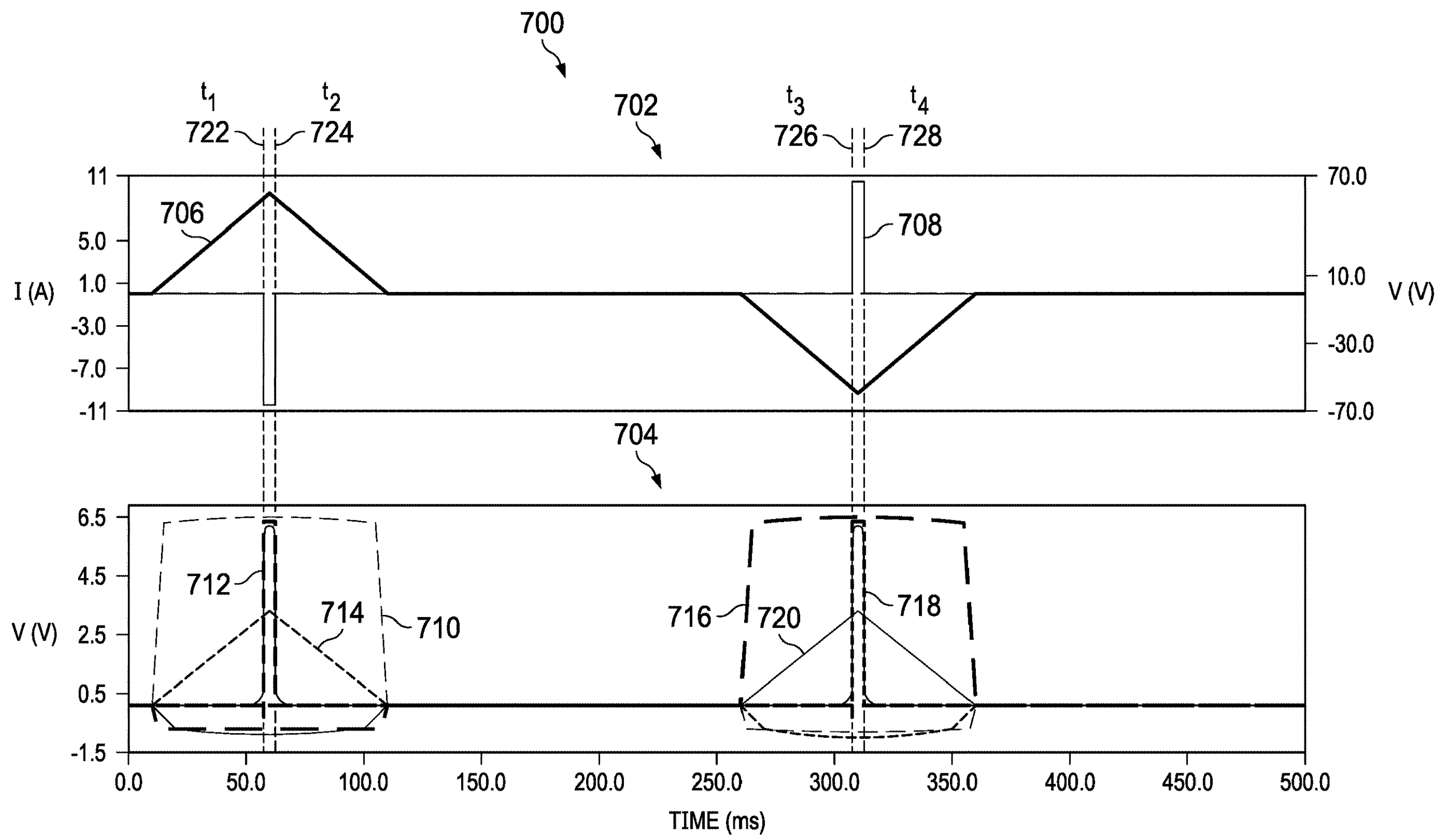
FIG. 7 is a timing diagram illustrating example operation of the example passive gate driver of FIGS. 4, 5, and 6.

FIG. 7 is a timing diagram 700 illustrating example operation of the example passive gate driver 114 of FIGS. 4, 5, and 6. The timing diagram 700 includes two plots. The timing diagram 700 includes an example first plot 702 of the voltage at the input voltage node $V_{IN}$ (e.g., illustrated as line 706) and the shunt current, $I_{SHUNT}$, (e.g., illustrated as line 708) in amps versus time in ms. The timing diagram 700 includes an example second plot 704 of the first positive clamp voltage $V_{CLAMP,\ P,\ 1}$ (e.g., illustrated as line 710), the voltage at the positive EOS gate drive node $V_{GATE,\ P}$ (e.g., illustrated as line 712), the positive trigger voltage $V_{TRIG,\ P}$ (e.g., illustrated as line 714), the first negative clamp voltage $V_{CLAMP,\ N,\ 1}$ (e.g., illustrated as line 716), the voltage at the negative EOS gate drive node $V_{GATE,\ N}$ (e.g., illustrated as line 718), and the negative trigger voltage $V_{TRIG,\ N}$ (e.g., illustrated as line 720), in volts versus time in ms. In the example of FIG. 7, the timing diagram 700 includes a first time 722 ($t_1$), a second time 724 ($t_2$), a third time 726 ($t_3$), and a fourth time 728 ($t_4$).

In the illustrated example of FIG. 7, shortly before the first time 722 ($t_1$), the voltage at the input voltage node $V_{IN}$ (e.g., line 706) is ramping to approximately 60V. Also, shortly before the first time 722 ($t_1$), the positive trigger voltage $V_{TRIG,\ P}$ (e.g., line 714) is ramping to approximately 3.5V. At the first time 722 ($t_1$), the voltage at the input voltage node $V_{IN}$ (e.g., line 706) exceeds approximately 55V and the positive trigger voltage $V_{TRIG,\ P}$ (e.g., line 714) exceeds the second positive clamp voltage $V_{CLAMP,\ P,\ 2}$ (e.g., $V_{TRIG,\ P} \geq 3V$), indicating the start of a positive EOS event. For example, the positive trigger voltage $V_{TRIG,\ P}$ (e.g., line 714) exceeding the second positive clamp voltage $V_{CLAMP,\ P,\ 2}$ (e.g., $V_{TRIG,\ P} \geq 3V$) is indicative that the voltage at the input voltage node $V_{IN}$ (e.g., line 706) is greater than or equal to 55V. Also, at the first time 722 ($t_1$), the passive gate driver 114 transitions from outputting a logic low value (e.g., approximately 0V) to outputting a logic high value (e.g., approximately 6.5V) at the positive EOS gate drive node $V_{GATE,\ P}$ (e.g., line 712) enabling (e.g., closing) the second shunt switch 118 and causing the second shunt switch 118 and the second diode 120 to conduct the shunt current, $I_{SHUNT}$, (e.g., line 708). Also, at the first time 722 ($t_1$), the shunt current, $I_{SHUNT}$, (e.g., line 708) transitions from approximately 0 A to approximately −10 A as measured with respect to the input voltage node $V_{IN}$. For example, during a positive EOS event, current flow from the input voltage node $V_{IN}$ to the power path protection device 102.

In the illustrated example of FIG. 7, between the first time 722 ($t_1$) and the second time 724 ($t_2$), the voltage at the input voltage node $V_{IN}$ (e.g., line 706) remains above approximately 55V and the positive trigger voltage $V_{TRIG,\ P}$ (e.g., line 714) remains above the second positive clamp voltage $V_{CLAMP,\ P,\ 2}$. Similarly, between the first time 722 ($t_1$) and the second time 724 ($t_2$), the passive gate driver 114 continues to output a logic high value (e.g., approximately 6.5V) at the positive EOS gate drive node $V_{GATE,\ P}$ (e.g., line 712) enabling (e.g., closing) the second shunt switch 118 and causing the second shunt switch 118 and the second diode 120 to conduct the shunt current, $I_{SHUNT}$, (e.g., line 708). Also, between the first time 722 ($t_1$) and the second time 724 ($t_2$), the shunt current, $I_{SHUNT}$, (e.g., line 708) remains at approximately 10 A.

In the illustrated example of FIG. 7, at the second time 724 ($t_2$), the voltage at the input voltage node $V_{IN}$ (e.g., line 706) falls below approximately 55V and the positive trigger voltage $V_{TRIG,\ P}$ (e.g., line 714) falls below the second positive clamp voltage $V_{CLAMP,\ P,\ 2}$ (e.g., $V_{TRIG,\ P} < 3V$), indicating the end of the positive EOS event. Also, at the second time 724 ($t_2$), the passive gate driver 114 transitions from outputting a logic high value (e.g., approximately 6.5V) to outputting a logic low value (e.g., approximately 0V) at the positive EOS gate drive node $V_{GATE,\ P}$ (e.g., line 712) disabling (e.g., opening) the second shunt switch 118 and advantageously preventing the second shunt switch 118 and the second diode 120 from conducting the shunt current, $I_{SHUNT}$, (e.g., line 708). Also, at the second time 724 ($t_2$), the shunt current, $I_{SHUNT}$, (e.g., line 708) transitions from approximately −10 A to approximately 0 A. Accordingly, during positive EOS events, the passive gate driver 114 protects the eFuse 124 from potentially dangerous currents.

In the illustrated example of FIG. 7, shortly before the third time 726 ($t_3$), the voltage at the input voltage node $V_{IN}$ (e.g., line 706) is ramping to approximately −60V. Also, shortly before the third time 726 ($t_3$), the negative trigger voltage $V_{TRIG,\ N}$ (e.g., line 720) is ramping to approximately 3.5V above the voltage at the first voltage node $V_1$ (e.g., $V_{TRIG,\ N} = -56.5V$ and $V_1 = -60V$). At the third time 726 ($t_3$), the voltage at the input voltage node $V_{IN}$ (e.g., line 706) exceeds approximately −55V and the negative trigger voltage $V_{TRIG,\ N}$ (e.g., line 720) falls below the second negative clamp voltage $V_{CLAMP,\ N,\ 2}$ (e.g., $V_{TRIG,\ N} \leq -57V$), indicating the start of a negative EOS event. For example, the negative trigger voltage $V_{TRIG,\ N}$ (e.g., line 720) falling below the second negative clamp voltage $V_{CLAMP,\ N,\ 2}$ (e.g., $V_{TRIG,\ N} \leq -57V$) is indicative that the voltage at the input voltage node $V_{IN}$ (e.g., line 706) is less than or equal to −55V. Also, at the third time 726 ($t_3$), the passive gate driver 114 transitions from outputting a logic low value (e.g., approximately 0V) to outputting a logic high value (e.g., approximately 6.5V) at the negative EOS gate drive node $V_{GATE,\ N}$ (e.g., line 716) enabling (e.g., closing) the first shunt switch 116 and causing the first shunt switch 116 and the third diode 122 to conduct (e.g., provide) the shunt current, $I_{SHUNT}$, (e.g., line 708). Also, at the third time 726 ($t_3$), the shunt current, $I_{SHUNT}$, (e.g., line 708) transitions from approximately 0 A to approximately 10 A as measured with respect to the input voltage node $V_{IN}$. For example, during a negative EOS event, current flow from the power path protection device 102 to the input voltage node $V_{IN}$.

In the illustrated example of FIG. 7, between the third time 726 ($t_3$) and the fourth time 728 ($t_4$), the voltage at the input voltage node $V_{IN}$ (e.g., line 706) remains below approximately −55V and the negative trigger voltage $V_{TRIG, N}$ (e.g., line 720) remains below the second negative clamp voltage $V_{CLAMP, N, 2}$. Similarly, between the third time 726 ($t_3$) and the fourth time 728 ($t_4$), the passive gate driver 114 continues to output a logic high value (e.g., approximately 6.5V) at the negative EOS gate drive node $V_{GATE, N}$ (e.g., line 718) enabling (e.g., closing) the first shunt switch 116 and causing the first shunt switch 116 and the third diode 122 to conduct the shunt current, $I_{SHUNT}$, (e.g., line 708). Also, between the third time 726 ($t_3$) and the fourth time 728 ($t_4$), the shunt current, $I_{SHUNT}$, (e.g., line 708) remains at approximately −10 A.

In the illustrated example of FIG. 7, at the fourth time 728 ($t_4$), the voltage at the input voltage node $V_{IN}$ (e.g., line 706) rises above approximately −55V and the negative trigger voltage $V_{TRIG, N}$ (e.g., line 720) rises above the second negative clamp voltage $V_{CLAMP, N, 2}$ (e.g., $V_{TRIG, N}$>−57V), indicating the end of the negative EOS event. Also, at the fourth time 728 ($t_4$), the passive gate driver 114 transitions from outputting a logic high value (e.g., approximately 6.5V) to outputting a logic low value (e.g., approximately 0V) at the negative EOS gate drive node $V_{GATE, N}$ (e.g., line 718) disabling (e.g., opening) the first shunt switch 116 and advantageously preventing the first shunt switch 116 and the third diode 122 from conducting the shunt current, $I_{SHUNT}$, (e.g., line 708). Also, at the fourth time 728 ($t_4$), the shunt current, $I_{SHUNT}$, (e.g., line 708) transitions from approximately 10 A to approximately 0 A. Accordingly, during negative EOS events, the passive gate driver 114 protects the eFuse 124 from potentially dangerous currents.

While an example manner of implementing the power path protection device 102 of FIG. 1 is illustrated in FIGS. 1, 2, and/or 3, one or more of the elements, processes and/or devices illustrated in FIGS. 1, 2, and/or 3 may be combined, divided, re-arranged, omitted, eliminated and/or implemented in any other way. Further, the example first diode 104, the example fuse assembly 112, the example passive gate driver 114, the example first shunt switch 116, the example second shunt switch 118, the example second diode 120, the example third diode 122, the example eFuse 124, the example gate driver 126, the example blocking switch 128, the example passing switch 130, the example fourth diode 132, the example fifth diode 134, the example first fuse 302, the example first electrical contact 304, the example second electrical contact 306, the example second fuse 308, the example first electrical contact 310, the example second electrical contact 312, and/or, more generally, the example power path protection device 102 of FIGS. 1, 2, and/or 3 may be implemented by hardware, software, firmware and/or any combination of hardware, software and/or firmware. Thus, for example, any of the example first diode 104, the example fuse assembly 112, the example passive gate driver 114, the example first shunt switch 116, the example second shunt switch 118, the example second diode 120, the example third diode 122, the example eFuse 124, the example gate driver 126, the example blocking switch 128, the example passing switch 130, the example fourth diode 132, the example fifth diode 134, the example first fuse 302, the example first electrical contact 304, the example second electrical contact 306, the example second fuse 308, the example first electrical contact 310, the example second electrical contact 312, and/or, more generally, the example power path protection device 102 of FIGS. 1, 2, and/or 3 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). In a purely software and/or firmware implementation, at least one of the example first diode 104, the example fuse assembly 112, the example passive gate driver 114, the example first shunt switch 116, the example second shunt switch 118, the example second diode 120, the example third diode 122, the example eFuse 124, the example gate driver 126, the example blocking switch 128, the example passing switch 130, the example fourth diode 132, the example fifth diode 134, the example first fuse 302, the example first electrical contact 304, the example second electrical contact 306, the example second fuse 308, the example first electrical contact 310, the example second electrical contact 312, and/or, more generally, the example power path protection device 102 of FIGS. 1, 2, and/or 3 is/are hereby expressly defined to include a non-transitory computer readable storage device or storage disk such as a memory, a digital versatile disk (DVD), a compact disk (CD), a Blu-ray disk, etc. including the software and/or firmware. Further still, the example power path protection device 102 of FIGS. 1, 2, and/or 3 may include one or more elements, processes and/or devices in addition to, or instead of, those illustrated in FIGS. 1, 2, and/or 3, and/or may include more than one of any or all of the illustrated elements, processes and devices.

Also, while an example manner of implementing the passive gate driver 114 of FIGS. 1, 2, and/or 3 is illustrated in FIGS. 4, 5, and/or 6, one or more of the elements, processes and/or devices illustrated in FIGS. 4, 5, and/or 6 may be combined, divided, re-arranged, omitted, eliminated and/or implemented in any other way. Further, the example positive gate driver 402, the example negative gate driver 404, the example first diode assembly 406, the example first resistor 408, $R_1$, the example second diode assembly 410, the example second resistor 412, $R_2$, the example third resistor 414, $R_3$, the example first potentiometer 416, $R_{P1}$, the example fourth resistor 418, $R_4$, the example fifth resistor 420, $R_5$, the example first comparator 422, the example first inverter 424, the example first driver switch 426, the example second driver switch 428, the example third diode assembly 430, the example fourth diode assembly 432, the example sixth resistor 434, $R_6$, the example second potentiometer 436, $R_{P2}$, the example seventh resistor 438, $R_7$, the example eighth resistor 440, $R_8$, the example ninth resistor 442, $R_9$, the example tenth resistor 444, $R_{10}$, the example second comparator 446, the example second inverter 448, the example third driver switch 450, the example fourth driver switch 452, the example fifth diode assembly 454, the example first switch 502, the example first diode 504, the example capacitor 506, $C_1$, the example second diode 508, the example third diode 510, the example second switch 512, the example eleventh resistor 514, $R_{11}$, the example twelfth resistor 516, $R_{12}$, the example fourth diode 518, the example fifth diode 520, the example sixth diode 522, the example seventh diode 524, the example eighth diode 526, the example ninth diode 528, the example tenth diode 530, the example third switch 532, the example thirteenth resistor 534, $R_{13}$, the example fourteenth resistor 536, $R_{14}$, the example eleventh diode 538, the example twelfth diode 540, the example thirteenth diode 542, the example fourteenth diode 544, the example fifteenth diode 546, and/or, more generally, the example passive gate driver 114 of FIGS. 4 and/or 5, and/or the example first diode 602, the example first resistor 604, $R_1$, the example second diode 606, the example third diode 608, the example second resistor 610, $R_2$, the example third resistor 612, $R_3$, the example fourth resistor 614, $R_4$, the example fifth resistor 616, $R_5$, the example first comparator 618, the example first delay circuit 620, the example first logic gate 622, the example fourth diode 624, the example sixth resistor 626, $R_6$, the example second comparator 628, the example second delay circuit 630, the example second logic gate 632, and/or, more generally the example passive gate driver 114 of FIG. 6 may be implemented by hardware, software, firmware and/or any combination of hardware, software and/or firmware. Thus, for example, any of the example positive gate driver 402, the example negative gate driver 404, the example first diode assembly 406, the example first resistor 408, $R_1$, the example second diode assembly 410, the example second resistor 412, $R_2$, the example third resistor 414, $R_3$, the example first potentiometer 416, $R_{P1}$, the example fourth resistor 418, $R_4$, the example fifth resistor 420, $R_5$, the example first comparator 422, the example first inverter 424, the example first driver switch 426, the example second driver switch 428, the example third diode assembly 430, the example fourth diode assembly 432, the example sixth resistor 434, $R_6$, the example second potentiometer 436, $R_{P2}$, the example seventh resistor 438, $R_7$, the example eighth resistor 440, $R_8$, the example ninth resistor 442, $R_9$, the example tenth resistor 444, $R_{10}$, the example second comparator 446, the example second inverter 448, the example third driver switch 450, the example fourth driver switch 452, the example fifth diode assembly 454, the example first switch 502, the example first diode 504, the example capacitor 506, $C_1$, the example second diode 508, the example third diode 510, the example second switch 512, the example eleventh resistor 514, $R_{11}$, the example twelfth resistor 516, $R_{12}$, the example fourth diode 518, the example fifth diode 520, the example sixth diode 522, the example seventh diode 524, the example eighth diode 526, the example ninth diode 528, the example tenth diode 530, the example third switch 532, the example thirteenth resistor 534, $R_{13}$, the example fourteenth resistor 536, $R_{14}$, the example eleventh diode 538, the example twelfth diode 540, the example thirteenth diode 542, the example fourteenth diode 544, the example fifteenth diode 546, and/or, more generally, the example passive gate driver 114 of FIGS. 4 and/or 5, and/or the example first diode 602, the example first resistor 604, $R_1$, the example second diode 606, the example third diode 608, the example second resistor 610, $R_2$, the example third resistor 612, $R_3$, the example fourth resistor 614, $R_4$, the example fifth resistor 616, $R_5$, the example first comparator 618, the example first delay circuit 620, the example first logic gate 622, the example fourth diode 624, the example sixth resistor 626, $R_6$, the example second comparator 628, the example second delay circuit 630, the example second logic gate 632, and/or, more generally the example passive gate driver 114 of FIG. 6 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). In a purely software and/or firmware implementation, at least one of the example positive gate driver 402, the example negative gate driver 404, the example first diode assembly 406, the example first resistor 408, $R_1$, the example second diode assembly 410, the example second resistor 412, $R_2$, the example third resistor 414, $R_3$, the example first potentiometer 416, $R_{P1}$, the example fourth resistor 418, $R_4$, the example fifth resistor 420, $R_5$, the example first comparator 422, the example first inverter 424, the example first driver switch 426, the example second driver switch 428, the example third diode assembly 430, the example fourth diode assembly 432, the example sixth resistor 434, $R_6$, the example second potentiometer 436, $R_{P2}$, the example seventh resistor 438, $R_7$, the example eighth resistor 440, $R_8$, the example ninth resistor 442, $R_9$, the example tenth resistor 444, $R_{10}$, the example second comparator 446, the example second inverter 448, the example third driver switch 450, the example fourth driver switch 452, the example fifth diode assembly 454, the example first switch 502, the example first diode 504, the example capacitor 506, $C_1$, the example second diode 508, the example third diode 510, the example second switch 512, the example eleventh resistor 514, $R_{11}$, the example twelfth resistor 516, $R_{12}$, the example fourth diode 518, the example fifth diode 520, the example sixth diode 522, the example seventh diode 524, the example eighth diode 526, the example ninth diode 528, the example tenth diode 530, the example third switch 532, the example thirteenth resistor 534, $R_{13}$, the example fourteenth resistor 536, $R_{14}$, the example eleventh diode 538, the example twelfth diode 540, the example thirteenth diode 542, the example fourteenth diode 544, the example fifteenth diode 546, and/or, more generally, the example passive gate driver 114 of FIGS. 4 and/or 5, and/or the example first diode 602, the example first resistor 604, $R_1$, the example second diode 606, the example third diode 608, the example second resistor 610, $R_2$, the example third resistor 612, $R_3$, the example fourth resistor 614, $R_4$, the example fifth resistor 616, $R_5$, the example first comparator 618, the example first delay circuit 620, the example first logic gate 622, the example fourth diode 624, the example sixth resistor 626, $R_6$, the example second comparator 628, the example second delay circuit 630, the example second logic gate 632, and/or, more generally the example passive gate driver 114 of FIG. 6 is/are hereby expressly defined to include a non-transitory computer readable storage device or storage disk such as a memory, a digital versatile disk (DVD), a compact disk (CD), a Blu-ray disk, etc. including the software and/or firmware. Further still, the example passive gate driver 114 of FIGS. 4, 5, and/or 6 may include one or more elements, processes and/or devices in addition to, or instead of, those illustrated in FIGS. 4, 5, and/or 6, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8:
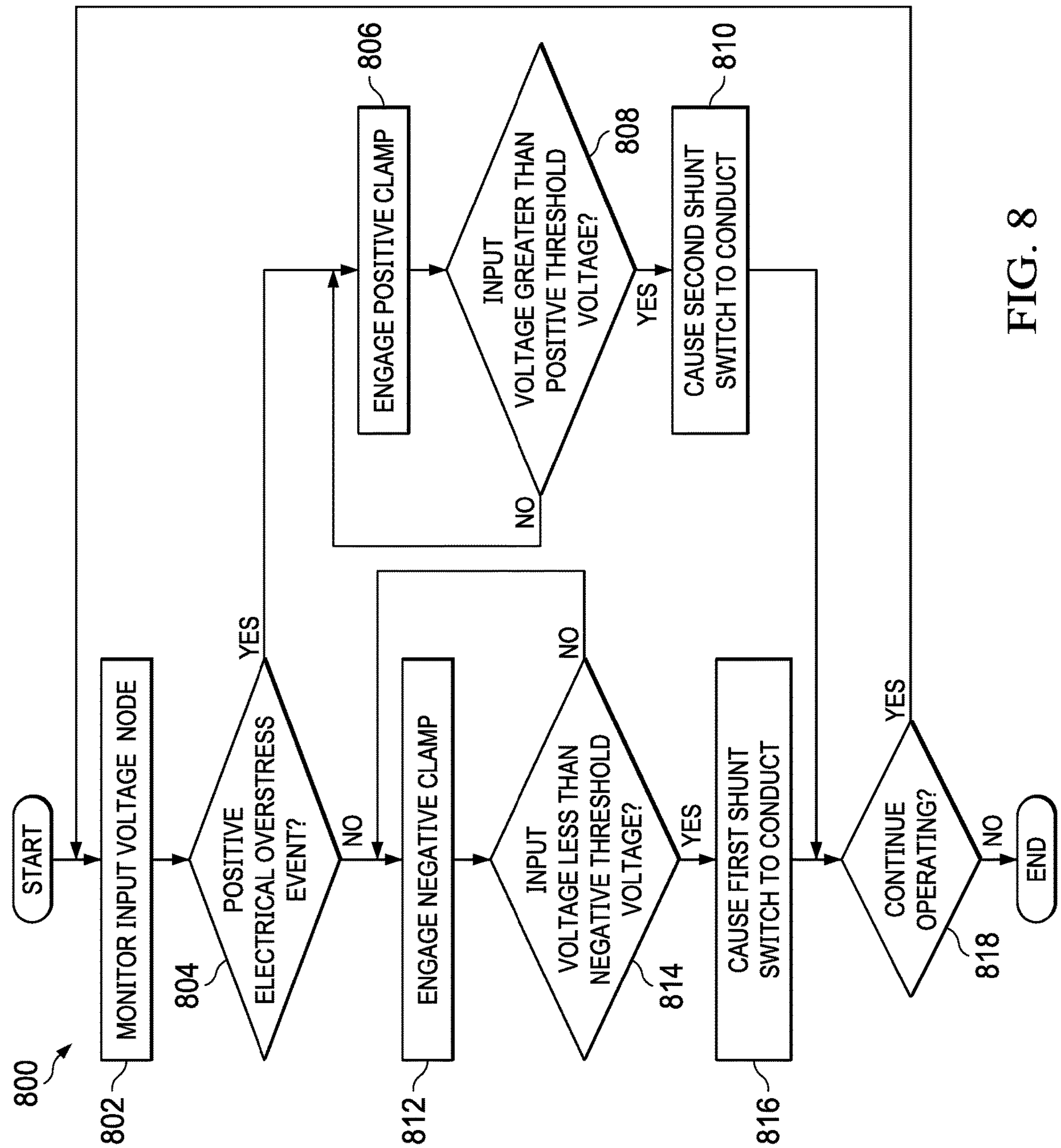
FIG. 8 is a flowchart representative of a process that may be executed to implement the example passive gate driver of FIGS. 1, 2, 3, 4, 5, and/or 6.

A flowchart representative of example hardware logic, machine-readable instructions, hardware implemented state machines, and/or any combination thereof for implementing the passive gate driver 114 of FIGS. 4, 5, and 6 is shown in FIG. 8. The machine-readable instructions may be one or more executable programs or portion(s) of an executable program for execution by a computer processor and/or processor circuitry. The program may be embodied in software stored on a non-transitory computer readable storage medium such as a CD-ROM, a floppy disk, a hard drive, a DVD, a Blu-ray disk, or a memory associated with a processor, but the entire program and/or parts thereof could alternatively be executed by a device other than the processor and/or embodied in firmware or dedicated hardware. Further, although the example program is described with reference to the flowchart illustrated in FIG. 8, many other methods of implementing the example passive gate driver 114 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

The machine-readable instructions described herein may be stored in one or more of a compressed format, an encrypted format, a fragmented format, a compiled format, an executable format, a packaged format, etc. Machine-readable instructions as described herein may be stored as data or a data structure (e.g., portions of instructions, code, representations of code, etc.) that may be utilized to create, manufacture, and/or produce machine executable instructions. For example, the machine-readable instructions may be fragmented and stored on one or more storage devices and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine-readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine-readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable media, as used herein, may include machine-readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As described above, the example processes of FIG. 4 may be implemented using executable instructions (e.g., computer and/or machine-readable instructions) stored on a non-transitory computer and/or machine-readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 8 is a flowchart representative of a process 800 that may be executed to implement the example passive gate driver 114 of FIGS. 1, 2, 3, 4, 5, and/or 6. For example, the process 800 may be implemented by machine-readable instructions that may be executed by a processor to implement thee passive gate driver 114. The process 800 begins at block 802 where the passive gate driver 114 monitors the voltage at the input voltage node $V_{IN}$ (e.g., via the fuse assembly 112). For example, the second diode assembly 410 (e.g., the third diode 510) and/or the fourth diode assembly 432 (e.g., the ninth diode 528) monitors the voltage at the input voltage node $V_{IN}$. Additionally or alternatively, the first diode 602 and/or the second diode 606 monitors the voltage at the input voltage node $V_{IN}$.

In the illustrated example of FIG. 8, responsive to a positive EOS event (e.g., block 804: YES), the process 800 proceeds to block 806 where the passive gate driver 114 engages a positive clamp. For example, the second diode assembly 410 (e.g., the second diode 508) clamps the first positive clamp voltage $V_{CLAMP, P, 1}$ to between 5V and 6V. Additionally or alternatively, the second diode 606 clamps the first positive clamp voltage $V_{CLAMP, P, 1}$ to between 5V and 6V. At block 808, the passive gate driver 114 determines whether the voltage at the input voltage node $V_{IN}$ is greater than a positive threshold voltage. For example, the first comparator 422 determines whether the positive trigger voltage $V_{TRIG, P}$ is greater than the second positive clamp voltage $V_{CLAMP, P, 2}$ (e.g., the positive threshold voltage). Additionally or alternatively, the first comparator 618 determines whether the positive trigger voltage $V_{TRIG, P}$ is greater than the second positive clamp voltage $V_{CLAMP, P, 2}$ (e.g., the positive threshold voltage).

In the illustrated example of FIG. 8, responsive to the passive gate driver 114 determining that the voltage at the input voltage node $V_{IN}$ is not greater than the positive threshold voltage (e.g., block 808: NO), the process 800 returns to block 806. responsive to the passive gate driver 114 determining that the voltage at the input voltage node $V_{IN}$ is greater than the positive threshold voltage (e.g., block 808: YES), the process 800 proceeds to block 810. At block 810, the passive gate driver 114 causes the second shunt switch 118 to conduct. For example, the first comparator 422 enables (e.g., closes) the first driver switch 426, causing a logic high value to be present at the positive EOS gate drive node $V_{GATE, P}$, thereby causing the second shunt switch 118 to conduct current. Additionally or alternatively, the first comparator 618 causes the first logic gate 622 to output a logic high value at the positive EOS gate drive node $V_{GATE,}$ $_P$, thereby causing the second shunt switch 118 to conduct (e.g., provide) current. After block 810, the process 800 proceeds to block 818.

In the illustrated example of FIG. 8, responsive to a negative EOS event (e.g., block 804: NO), the process 800 proceeds to block 812 where the passive gate driver 114 engages a negative clamp. For example, the fourth diode assembly 432 (e.g., the tenth diode 530) clamps the first negative clamp voltage $V_{CLAMP, N, 1}$ to between −54V and −55V. Additionally or alternatively, the first diode 602 clamps the first negative clamp voltage $V_{CLAMP, N, 1}$ to between −54V and −55V. At block 814, the passive gate driver 114 determines whether the voltage at the input voltage node $V_{IN}$ is less than a negative threshold voltage. For example, the second comparator 446 determines whether the negative trigger voltage $V_{TRIG, N}$ is less than the second negative clamp voltage $V_{CLAMP, N, 2}$ (e.g., the negative threshold voltage). Additionally or alternatively, the second comparator 628 determines whether the negative trigger voltage $V_{TRIG, N}$ is less than the second negative clamp voltage $V_{CLAMP, N, 2}$ (e.g., the negative threshold voltage).

In the illustrated example of FIG. 8, responsive to the passive gate driver 114 determining that the voltage at the input voltage node $V_{IN}$ is not less than the negative threshold voltage (e.g., block 814: NO), the process 800 returns to block 812. Responsive to the passive gate driver 114 determining that the voltage at the input voltage node $V_{IN}$ is less than the negative threshold voltage (e.g., block 814: YES), the process 800 proceeds to block 816. At block 816, the passive gate driver 114 causes the first shunt switch 116 to conduct. For example, the second comparator 446 enables (e.g., closes) the third driver switch 450, causing a logic high value to be present at the negative EOS gate drive node $V_{GATE, N}$, thereby causing the first shunt switch 116 to conduct current. Additionally or alternatively, the second comparator 628 causes the second logic gate 632 to output a logic high value at the negative EOS gate drive node $V_{GATE, N}$, thereby causing the first shunt switch 116 to conduct (e.g., provide) current. After block 816, the process 800 proceeds to block 818.

In the illustrated example of FIG. 8, responsive to a continued operation condition (e.g., block 818: YES), the passive gate driver 114 continues operating and the process 800 returns to block 802. Alternatively (e.g., block 818: NO), the passive gate driver 114 does not continue operating and the process 800 terminates. For example, the continued supply of power to the passive gate driver 114 will cause the passive gate driver 114 to continue operating whereas a loss of power will cause the passive gate driver 114 to terminate operation.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the operation of power path protection devices by reducing redundant components, increasing the reaction speed of power path protection devices, and improving the accuracy of power path protection device operation. Also, example methods, apparatus and articles of manufacture described herein improve the operation of power path protection devices by handling bipolar EOS events and bipolar surge events. Example methods, apparatus and articles of manufacture described herein improve the operation of power path protection devices by integrating a fail-safe solution within an IC comprising a power path protection device. Example methods, apparatus and articles of manufacture described herein improve the operation of power path protection devices by increasing the SOA of power path protection devices. Also, example methods, apparatus and articles of manufacture described herein improve the operation of power path protection devices by distinguishing between surge events and EOS events.

Modifications are possible in the described embodiments, and other embodiments are possible, within the scope of the claims.

What is claimed is:

1. An integrated circuit comprising:

a shunt circuit having a shunt terminal;

a semiconductor substrate; and a first metal layer and a second metal layer on the semiconductor substrate, the first metal layer including a first metal fuse coupled between an input terminal and a diode terminal, and the second metal layer including a second metal fuse coupled between the diode terminal and the shunt terminal.

2. The integrated circuit of claim 1, further comprising an electronic fuse (eFuse) having an eFuse input and an eFuse output, the eFuse input coupled to the shunt terminal, and the eFuse output coupled to an output terminal.

3. The integrated circuit of claim 1, wherein the shunt circuit includes:

a first switch and a second switch coupled between the shunt terminal and a ground terminal, in which the first switch has a first switch control terminal and includes a first diode having a first anode and a first cathode, the second switch has a second switch control terminal and includes a second diode having a second anode and a second cathode, the first anode is coupled to the shunt terminal, the first cathode is coupled to the second cathode, and the second anode is coupled to the ground terminal; and a driver having a driver input and first and second driver outputs, the driver input coupled to the shunt terminal, the first driver output is coupled to the first switch control terminal, and the second driver output coupled to the second switch control terminal.

4. The integrated circuit of claim 3, wherein the driver is configured to:

set the first driver output to a first state responsive to a voltage at the shunt terminal being below a negative threshold voltage; and set the first driver output to a second state responsive to the voltage being above the negative threshold voltage; and wherein the first switch is enabled responsive to the first driver output being in the first state, and the first switch is disabled responsive to the first driver output being in the second state.

5. The integrated circuit of claim 4, wherein the driver is configured to:

set the second driver output to a first state responsive to a voltage at the shunt terminal being above a positive threshold voltage; and set the second driver output to a second state responsive to the voltage being below the positive threshold voltage; and wherein the second switch is enabled responsive to the second driver output being in the first state, and the second switch is disabled responsive to the second driver output being in the second state.

6. The integrated circuit of claim 5, wherein the driver is configured to enable the second switch in a positive electrical over stress (EOS) event, and enable the first switch in a negative EOS event.

7. The integrated circuit of claim 5, wherein the driver includes a first resistor, a third diode, and a fourth diode coupled between the shunt terminal and the ground terminal, in which the third diode has a third anode and a third cathode, the fourth diode has a fourth anode and a fourth cathode, the third cathode is coupled to the first resistor, the third anode is coupled to the ground terminal, the fourth anode is coupled to the third cathode, and the first resistor, the third diode, and the fourth diode are configured to provide a positive clamp voltage at the fourth cathode, and the positive threshold voltage is based on the positive clamp voltage; and wherein the driver includes a second resistor, a fifth diode, a sixth diode, and a seventh diode coupled between the shunt terminal and the ground terminal, the fifth diode has a fifth anode and a fifth cathode, the sixth diode has a sixth anode and a sixth cathode, the seventh diode has a seventh anode and a seventh cathode, the fifth cathode is coupled to the shunt terminal, the fifth anode is coupled to the sixth anode, the second resistor is coupled between the sixth cathode and the ground terminal, the seventh anode coupled to the sixth cathode, the second resistor, the fifth diode, the sixth diode, and the seventh diode are configured to provide a negative clamp voltage at the seventh cathode, and the negative threshold voltage is based on the negative clamp voltage.

8. The integrated circuit of claim 5, wherein the driver includes a resistor, a third diode, and a fourth diode coupled between the shunt terminal and the ground terminal, in which the third diode has a third anode and a third cathode, the fourth diode has a fourth anode and a fourth cathode, the third anode is coupled to the shunt terminal, the fourth anode is coupled to the ground terminal, the resistor is coupled between the third and fourth cathodes, and the resistor, the third diode, and the fourth diode are configured to provide a negative clamp voltage at the third cathode and a positive clamp voltage at the fourth cathode;

in which the negative threshold voltage is based on the negative clamp voltage and the positive threshold voltage is based on the positive clamp voltage.

9. The integrated circuit of claim 1, wherein the first metal fuse is configured to conduct a surge current through the diode terminal.

10. An integrated circuit comprising:

a first switch;

a second switch coupled between the first switch and a ground terminal;

a third switch;

a fourth switch coupled between the third switch and an output terminal;

a first metal fuse coupled between an input terminal and a diode terminal; and a second metal fuse coupled between the diode terminal and a first terminal of the first switch, and between the diode terminal and a second terminal of the second switch.

11. The integrated circuit of claim 10, wherein:

the first switch includes a first diode having a first anode and a first cathode;

the second switch includes a second diode having a second anode and a second cathode;

the third switch includes a third diode having a third anode and a third cathode;

the fourth switch includes a fourth diode having a fourth anode and a fourth cathode;

the first anode is coupled to the third anode and the second metal fuse;

the first cathode is coupled to the second cathode;

the second anode is coupled to the ground terminal;

the third cathode is coupled to the fourth cathode; and the fourth anode is coupled to the output terminal.

12. The integrated circuit of claim 11, wherein:

the first and second switches are part of a shunt circuit having a shunt terminal, in which the first and second switches are coupled between the shunt terminal and the ground terminal; and the third and fourth switches are part of an eFuse coupled between the shunt terminal and the output terminal.

13. The integrated circuit of claim 12, wherein:

the first switch has a first switch control terminal;

the second switch has a second switch control terminal; and the shunt circuit includes a driver having a driver input and first and second driver outputs, the driver input coupled to the shunt terminal, the first driver output coupled to the first switch control terminal, and the second driver output coupled to the second switch control terminal.

14. The integrated circuit of claim 13, wherein the driver is configured to:

set the first driver output to a first state responsive to a voltage at the shunt terminal being below a negative threshold voltage; and set the first driver output to a second state responsive to the voltage being above the negative threshold voltage; and wherein the first switch is enabled responsive to the first driver output being in the first state, and the first switch is disabled responsive to the first driver output being in the second state.

15. The integrated circuit of claim 14, wherein the driver is configured to:

set the second driver output to a first state responsive to a voltage at the shunt terminal being above a positive threshold voltage; and set the second driver output to a second state responsive to the voltage being below the positive threshold voltage; and wherein the second switch is enabled responsive to the second driver output being in the first state, and the second switch is disabled responsive to the second driver output being in the second state.

16. The integrated circuit of claim 15, wherein the driver is configured to enable the second switch in a positive electrical over stress (EOS) event, and enable the first switch in a negative EOS event.

17. The integrated circuit of claim 15, wherein the driver includes a first resistor, a fifth diode, and a sixth diode coupled between the shunt terminal and the ground terminal, in which the fifth diode has a fifth anode and a fifth cathode, the sixth diode has a sixth anode and a sixth cathode, the fifth cathode is coupled to the first resistor, the fifth anode is coupled to the ground terminal, the sixth anode is coupled to the fifth cathode, and the first resistor, the fifth diode, and the sixth diode are configured to provide a positive clamp voltage at the sixth cathode, and the positive threshold voltage is based on the positive clamp voltage; and wherein the driver includes a second resistor, a seventh diode, an eighth diode, and a ninth diode coupled between the shunt terminal and the ground terminal, the seventh diode has a seventh anode and a seventh cathode, the eighth diode has an eighth anode and an eighth cathode, the ninth diode has a ninth anode and a ninth cathode, the seventh cathode is coupled to the shunt terminal, the seventh anode is coupled to the eighth anode, the second resistor is coupled between the eighth cathode and the ground terminal, the ninth anode coupled to the eighth cathode, the second resistor, the seventh diode, the eighth diode, and the ninth diode are configured to provide a negative clamp voltage at the ninth cathode, and the negative threshold voltage is based on the negative clamp voltage.

18. The integrated circuit of claim 15, wherein the driver includes a resistor, a fifth diode, and a sixth diode coupled between the shunt terminal and the ground terminal, in which the fifth diode has a fifth anode and a fifth cathode, the sixth diode has a sixth anode and a sixth cathode, the fifth anode is coupled to the shunt terminal, the sixth anode is coupled to the ground terminal, the resistor is coupled between the fifth and sixth cathodes, and the resistor, the fifth diode, and the sixth diode are configured to provide a negative clamp voltage at the fifth cathode and a positive clamp voltage at the sixth cathode, in which the negative threshold voltage is based on the negative clamp voltage and the positive threshold voltage is based on the positive clamp voltage.

19. The integrated circuit of claim 10, wherein the integrated circuit includes a semiconductor substrate and first and second metal layers on the semiconductor substrate, in which the first metal layer includes the first metal fuse and the second metal layer includes the second metal fuse.

* * * * *